(12) United States Patent
Frederiksen

(10) Patent No.: US 12,379,097 B2
(45) Date of Patent: Aug. 5, 2025

(54) ELECTRICAL PLUG FOR CONNECTING TO A SUBSTRATE

(71) Applicant: LED iBond International A/S, Hørsholm (DK)

(72) Inventor: Lars Frederiksen, Gentofte (DK)

(73) Assignee: LED iBond International A/S, Farum (DK)

( * ) Notice: Subject to any disclaimer, the term of this patent is extended or adjusted under 35 U.S.C. 154(b) by 0 days.

(21) Appl. No.: 18/690,142

(22) PCT Filed: Sep. 20, 2022

(86) PCT No.: PCT/DK2022/050193
§ 371 (c)(1),
(2) Date: Mar. 7, 2024

(87) PCT Pub. No.: WO2023/041136
PCT Pub. Date: Mar. 23, 2023

(65) Prior Publication Data
US 2024/0426466 A1   Dec. 26, 2024

(30) Foreign Application Priority Data
Sep. 20, 2021  (DK) .......................... PA 2021 70460

(51) Int. Cl.
*F21V 19/00*    (2006.01)
*F21V 21/002*   (2006.01)
(Continued)

(52) U.S. Cl.
CPC ........ *F21V 19/0055* (2013.01); *F21V 21/002* (2013.01); *F21V 23/06* (2013.01); *F21Y 2115/10* (2016.08)

(58) Field of Classification Search
CPC .... H01R 33/205; H01R 33/09; F21V 19/0055
See application file for complete search history.

(56) References Cited

U.S. PATENT DOCUMENTS 2,847,560 A * 8/1958 Jensen ................... H01R 33/00
                                                    439/551
3,571,585 A * 3/1971 Schermerhorn ......... B60Q 3/14
                                                    362/631
(Continued)

FOREIGN PATENT DOCUMENTS

DE   102008021014 A1   10/2009
EP      2485342 A2      8/2012
(Continued)

OTHER PUBLICATIONS

International Search Report and Written Opinion issued in corresponding PCT Application No. PCT/DK2022/050193, dated Dec. 7, 2022, pp. 1-9.
(Continued)

*Primary Examiner* — Ismael Negron
(74) *Attorney, Agent, or Firm* — Robinson & Cole LLP

(57) ABSTRACT

A plug for mounting in a socket that includes bottom and top connection sites. The plug includes a bottom connection element complementary to the bottom connection site and having a bottom inner surface and a bottom contact interface; a top connection element complementary to the top connection site and having a top inner surface and a top contact interface; an assembly component separating the bottom connection element from the top connection element; a circuit board positioned between the bottom connection element and the top connection element, which circuit board has a first surface and an electrically conducting second surface and which circuit board carries an electronic component on the first surface or the electrically conducting second surface; and the electrically conducting second surface being in electric connection with the bottom inner surface and the first surface being in electric connection with the top inner surface.

20 Claims, 8 Drawing Sheets

(51) Int. Cl.
  *F21V 23/06* (2006.01)
  *H01R 33/20* (2006.01)
  *F21Y 115/10* (2016.01)

(56) References Cited

U.S. PATENT DOCUMENTS

| | | | | | |
|---|---|---|---|---|---|
| 4,005,924 | A | * | 2/1977 | Nestor | H01R 33/09 439/77 |
| 4,468,585 | A | * | 8/1984 | Beyland | H01K 1/46 313/318.07 |
| 4,487,469 | A | * | 12/1984 | Bjork | H01R 33/9753 403/349 |
| 4,934,951 | A | * | 6/1990 | Schonath | H01R 33/09 313/51 |
| 5,378,158 | A | * | 1/1995 | Owen | F21V 19/0025 439/931 |
| 5,612,855 | A | * | 3/1997 | Heeb | F21V 19/006 439/558 |
| 6,840,776 | B2 | * | 1/2005 | Sørensen | H01R 33/94 439/699.2 |
| 8,506,120 | B2 | * | 8/2013 | Jensen | H01R 13/2442 362/267 |
| 9,103,531 | B2 | * | 8/2015 | De Anna | F21V 19/003 |
| 10,072,833 | B2 | * | 9/2018 | Ng | F21V 29/70 |
| 2009/0268470 | A1 | * | 10/2009 | Okimura | F21K 9/20 362/311.02 |

FOREIGN PATENT DOCUMENTS

| | | |
|---|---|---|
| EP | 3553375 A1 | 10/2019 |
| WO | 2003017435 A1 | 2/2003 |
| WO | 2009076960 A1 | 6/2009 |
| WO | 2013117198 A1 | 8/2013 |
| WO | 2015104024 A1 | 7/2015 |
| WO | 2019210926 A1 | 11/2019 |
| WO | 2021170194 A1 | 9/2021 |

OTHER PUBLICATIONS

Search Report from corresponding DK Application No. PA 2021 70460, dated Feb. 16, 2022, pp. 1-4.

* cited by examiner

ELECTRICAL PLUG FOR CONNECTING TO A SUBSTRATE

CROSS REFERENCE TO RELATED APPLICATIONS

The instant application is a U.S. National Stage application of and claims priority to PCT/DK2022/050193, filed on Sep. 20, 2022, which is a PCT application of and claims priority to Danish Patent Application No. PA 2021 70460, filed on Sep. 20, 2021, the subject matter of both aforementioned applications are hereby incorporated by reference in their entireties.

FIELD OF THE INVENTION

The present invention relates to a plug for mounting in a socket in a composite board having two layers of an electrically conducting material separated by an insulator. The plug establishes electric connection between the electrically conducting layers and an electronic component in the plug. The plug is easily replaceable and thus allows easy replacement of the electronic component in the composite board. The invention also relates to a component fitting system comprising the composite board with the plug mounted in a socket.

BACKGROUND

Lamps have for many decades traditionally comprised a light bulb mounted in a socket, from which it can easily be replaced. Light emitting diodes (LED) are used more and more in place of light bulbs, and since LEDs have a greatly increased duration compared to a traditional light bulb, lighting fixtures based on LEDs typically do not allow replacement of the LED, since the LED is expected to outlive the lighting fixture. However, for many applications the option to replace the LEDs individually will be advantageous.

Composite boards are well known construction elements for LED based lamps where two electrically conducting plates separated by an insulating material are used to supply electricity to and from LEDs mounted in the composite board. Thus, WO 2003/017435 discloses an adapter for electrical power transfer for mounting in an aperture in such a composite board. The adapter comprises first pins establishing electrical connection with one of the layers when the adapter is mounted in an aperture, and a second pin adapted for establishing electrical connection with the other layer when mounting the adapter in the aperture.

WO 2009/076960 discloses an adapter with an LED for mounting in a hole in a composite board where the LED is fitted on a metal item. The heat conducting properties of the metal item are utilised for conducting heat from the LED away from the adapter and into the board while simultaneously operating as an electric conductor.

Other such systems are disclosed in EP 2485342, DE 102008021014 and WO 2013/117198.

WO 2015/104024 discloses a composite board with a circuit board carrying an LED in electrical connection with the first and the second electrically conducting layers. The composite board may comprise a controller adapted for communication of data signals via one of the electrically conducting layers to the LED.

WO 2019/210926 discloses an electrical supply module having a composite board with a recess where a coupling portion is located. The electrical supply module further comprises a coupling unit for attaching to an external unit. The external unit may have an electronic component so that the coupling unit can supply a current to the external unit.

It is an object of the invention to provide a plug with an electronic component, which plug can be mounted in and readily be replaced from a socket in a composite board.

SUMMARY

The present invention relates to plug for mounting in a socket of a substrate, the socket comprising a bottom connection site and a top connection site, the plug comprising a bottom connection element complementary to the bottom connection site, the bottom connection element having a bottom inner surface and a bottom contact interface for establishing an electrical connection to the substrate; a top connection element complementary to the top connection site, the top connection element having a top inner surface and a top contact interface for establishing an electrical connection to the substrate; an assembly component separating the bottom connection element from the top connection element; a circuit board positioned between the bottom connection element and the top connection element, which circuit board has a first surface and an electrically conducting second surface and which circuit board carries an electronic component on the first surface or the electrically conducting second surface; and the electrically conducting second surface being in electric connection with the bottom inner surface and the first surface being in electric connection with the top inner surface.

In a specific embodiment, the invention relates to a plug for mounting in a socket of a composite board, the plug comprising a bottom connection element complementary to a bottom connection site of the socket of the composite board, the bottom connection element having a bottom inner surface and a bottom contact interface for establishing an electrical connection to the composite board; a top connection element complementary to a top connection site of the socket of the composite board, the top connection element having a top inner surface and a top contact interface for establishing an electrical connection to the composite board; an assembly component separating the bottom connection element from the top connection element; a circuit board positioned between the bottom connection element and the top connection element, which circuit board has a first surface and an electrically conducting second surface and which circuit board carries an electronic component on the first surface; and the electrically conducting second surface being in electric connection with the bottom inner surface and the first surface being in electric connection with the top inner surface.

In another aspect, the present invention relates to a component fitting system comprising a plug according to the invention; a composite board comprising a bottom layer and a top layer of an electrically conducting material, which bottom layer and top layer are separated by an insulator of an electrically insulating material, the bottom layer or the top layer having an exterior surface; the exterior surface comprising a socket extending at least through the insulator and one of the bottom layer and the top layer, the socket having a bottom connection site at the bottom layer and a top connection site at the top layer; which bottom connection site and which top connection site are complementary to the bottom connection element and the top connection element, respectively, of the plug; wherein the plug is mounted in the socket to establish electrical connection between the bottom connection site and the bottom connection element and between the top connection site and the top connection element.

The plug of the disclosure can be mounted in and removed from the socket of a substrate, e.g., of a component fitting system of the disclosure. The substrate may be any structure having a socket with a bottom connection site and a top connection site for establishing an electrical connection between the plug and the composite board as described above. The substrate can generally be described to have an exterior surface, so that the socket is in the exterior surface. The substrate should have electrical connections allowing a power supply to provide electricity to the bottom connection site and the top connection site. The plug may for example be mounted in a composite board comprising a bottom layer and a top layer of an electrically conducting material, which bottom layer and top layer are separated by an insulator of an electrically insulating material, the bottom layer or the top layer having an exterior surface comprising the socket. The composite board may in particular be as defined above for the component fitting system of the disclosure. In the context of the disclosure, the substrate and the composite board may be any structure having a socket with a bottom connection site and a top connection site for establishing an electrical connection between the plug and the composite board as described above, and the substrate may also be referred to as a structure. In the present context, the terms "substrate", "structure" and "composite board" may be used interchangeably. Thus, the substrate, e.g., the composite board, may be any structure having a socket with an anodic connection site and a cathodic connection site in which the plug can be mounted to establish electrical connections between the bottom connection element and the anodic connection site and between the top connection element and the cathodic connection site or to establish electrical connections between the bottom connection element and the cathodic connection site and between the top connection element and the anodic connection site. In another aspect, the disclosure relates to a plug for mounting in a socket, e.g., a socket of a substrate, the plug comprising a bottom connection element complementary to a bottom connection site of the socket, the bottom connection element having a bottom inner surface and a bottom contact interface for establishing an electrical connection to the bottom connection site; a top connection element complementary to a top connection site of the socket, the top connection element having a top inner surface and a top contact interface for establishing an electrical connection to the top connection site; an assembly component separating the bottom connection element from the top connection element; a circuit board positioned between the bottom connection element and the top connection element, which circuit board has a first surface and an electrically conducting second surface and which circuit board carries an electronic component on the first surface; and the electrically conducting second surface being in contact with the bottom inner surface and the first surface being in electric connection with the top inner surface. The bottom connection site and the top connection site are electrically connected to a power supply, in particular a direct current (DC) power supply capable of providing a constant voltage or a constant current. Thus, the bottom connection site may be an anodic electrical connection site and the top connection site may be a cathodic electrical connection site, or the bottom connection site may be a cathodic electrical connection site and the top connection site may be an anodic electrical connection site. The power supply may provide electricity to the bottom layer and the top layer of a composite board having the socket, or the substrate, e.g., a substrate made from an electrically insulating material, such as a polymer or glass, may comprise electrical conductors, e.g., a first and a second conductor, electrically connected to the bottom connection site and to the top connection site, respectively.

In yet a further aspect, the disclosure relates to a component fitting system having a socket in an exterior surface, the socket having a bottom connection site and a top connection site electrically connected to a power supply, and a plug according to either aspect described above.

The present invention thus provides a plug having an electronic component, which plug is advantageously easy to mount in and remove from a socket so that the plug with the electronic component can be easily replaced. Replacement of an electronic component is particularly relevant where the electronic component is traditionally an integrated part of a larger structure so that the electronic components can be replaced individually without having to replace the whole structure.

Examples of electronic components where individual replacement is relevant are high-power light emitting diodes (LED), e.g., LEDs having a power rating above 1 W. The component fitting system of the disclosure may for example be a shelf for a vertical farm, which shelf is fitted with a plurality of high-power LEDs and optionally also other components, e.g., sensors and/or radio transmitters, where certain LEDs, e.g., depending on their individual forward voltage characteristic and/or their position in the shelf, have a shorter expected life time than other LEDs or other components so that the possible replacement of these LEDs via the plug is simplified compared to solutions not employing the plug. Another relevant use of the plug of the disclosure is in a disinfection system having a plurality of LEDs capable of emitting ultraviolet (UV) light, e.g., UV-C light, where individual replacement of LEDs is advantageous. Thus, when better, e.g., cheaper and in particular higher powered, UV-C LEDs become available the plug having a UV-C LED can easily be replaced.

In an example, the component fitting system of the disclosure is a shelf for a vertical farm, which shelf has a plurality of sockets, e.g., 10 to 1000 sockets, as defined above and a plurality of plugs where the electronic components in the plugs are LEDs having a power rating above 1 W. Specifically, the component fitting system may be an air transport unit as disclosed in WO 2021/170194.

In another example, the component fitting system of the disclosure is a UV-disinfection system comprising one or more composite boards having a plurality of sockets, e.g., 2 to 100 sockets, as defined above and a plurality of plugs where the electronic components in the plugs are UV-C LEDs. The plurality of sockets may for example have openings facing a target area for disinfection via the UV-C light. The target area may also be considered an interior space of the disinfection unit.

The bottom layer of the composite board is electrically connected to the bottom connection element of the plug, and the top layer of the composite board is electrically connected to the top connection element of the plug when the plug is mounted in the socket of the composite board to thereby provide an electrical circuit with the bottom layer, the electronic component and the top layer via the bottom connection element and the top connection element. However, the bottom layer and the top layer are otherwise not limited. In the context of the invention the bottom layer and the top layer may be referred to collectively as the "electrically conducting layers" or the "conducting layers". The electrically conducting layers may be made from any electrically conducting material. In particular, the electrically conducting layers may be made from a metal, e.g., aluminium, titanium, magnesium or copper.

The component fitting system has an exterior surface, and the exterior surface is any surface of the component fitting system facing the ambient surroundings. The component fitting system may be mounted on a wall or the like, but in the present context the surface of the component fitting system facing the wall may also be an exterior surface. Either of the electrically conducting layers may have the exterior surface, and the corresponding electrically conducting layer will typically be the "top layer", and the opposite electrically conducting layer will typically be the "bottom layer", and likewise the connection element closer to the top layer is the "top connection element", and the connection element closer to the bottom layer is the "bottom connection element". However, the terms "top" and "bottom" do not imply any specific orientation of the composite board or the plug but only serve to describe the layers and components relative to each other. In particular, either of the bottom layer and the top layer may have the exterior surface, or both of the bottom layer and the top layer may have exterior surfaces. Either of the bottom layer and the top layer may represent a front layer or a back layer of the composite board, and thereby also of the component fitting system. In general, when only one of the exterior surfaces has a socket, the corresponding electrically conducting layer, whether the bottom layer or the top layer, will generally be referred to as the front layer, and the opposite layer will be referred to as the back layer. However, it is also contemplated that both of the bottom layer and the top layer can have a socket.

One of the bottom connection elements and the top connection element is an anodic connection element, and the other of the top connection element and the bottom connection element is a cathodic connection element. Either of the bottom connection element and the top connection element may be the anodic connection element, and either of the bottom connection element and the top connection element may be the cathodic connection element. Correspondingly, one of the bottom layers and the top layer is an anode layer, and the other electrically conducting layer is a cathode layer. Either of the bottom layer and the top layer may be the anode layer, and either of the bottom layer and the top layer may be the cathode layer. When the bottom connection element is the anodic connection element, the bottom layer is the anode layer, the top connection element is the cathodic connection element, and the top layer is the cathode layer. When the bottom connection element is the cathodic connection element, the bottom layer is the cathode layer, the top connection element is the anodic connection element, and the top layer is the anode layer.

The plug is for mounting in the socket of the composite board. The socket may also be referred to as a "recess" or "hole". The socket has a perimeter, and the perimeter may have any shape. Preferably, the socket has a round perimeter, but it may also have a square or rectangular perimeter, or a perimeter of another shape. The socket may have any appropriate size, but in a certain example the socket has a first dimension in the range of 5 mm to 50 mm, and a second dimension in the range of 5 mm to 50 mm. For example, the socket may be round and have a diameter in the range of 5 mm to 50 mm, e.g., 15 mm to 25 mm or 15 mm to 20 mm. The socket may also be larger, e.g., having a diameter up to or at 100 mm. The socket extends at least through the insulator and one of the electrically conducting layers. Thereby, the socket provides access to the bottom layer and the top layer so that electrical connections can be made between the bottom layer and the bottom connection element of the plug and between the top layer and the top connection element of the plug. The socket may be considered to be a hole, which extends entirely through or partly through the composite board, e.g., the socket may comprise a hole in the exterior surface extending through the bottom layer or the top layer, as appropriate, which hole is aligned with a hole extending through the insulator. The hole through the electrically conducting layer will generally be a single hole, and the hole through the insulator may be a single hole or a plurality of holes aligned with the single hole through the electrically conducting layer. In a specific example, the socket comprises a single hole through the electrically conducting layer aligned with a single hole through the insulator. For example, the single hole through the electrically conducting layer may have the same shape and size when viewed from the exterior surface as the single hole through the insulator.

The socket has a bottom connection site at the bottom layer and a top connection site at the top layer. The bottom connection site and the top connection site may have any size and shape as desired, but the plug has a bottom connection element that is complementary to the bottom connection site and a top connection element that is complementary to the top connection site. It is also contemplated that the bottom connection element and/or the top connection element may comprise a coupling portion providing complementarity to the bottom connection site and the top connection site, respectively. It is likewise possible that the bottom connection site and/or the top connection site may comprise a coupling portion providing complementarity to the bottom connection element and the top connection element, respectively. The coupling portion may thus be a top coupling portion or a bottom coupling portion depending on its location in the plug or the component fitting system. For example, the bottom connection element may comprise a bottom coupling portion complementary to the bottom connection site or the bottom connection site may comprise a bottom coupling portion complementary to the bottom connection element. Likewise, the top connection element may comprise a top coupling portion complementary to the top connection site or the top connection site may comprise a top coupling portion complementary to the top connection element. Thus, the bottom connection element or site, or the bottom coupling portion when present, and the bottom connection site or element represent complementary connection means, and the top connection element or site, or the top coupling portion when present, and the top connection site or element also represent complementary connection means. In the present context, the complementary connection means may be referred to as the bottom complementary connection means and the top complementary connection means, respectively.

The complementary connection means may be selected freely, and the bottom complementary connection means and the top complementary connection means may be the same or different. It is preferred that the bottom complementary connection means and the top complementary connection means are different. It is furthermore preferred that the complementary connection means are releasable, e.g., so that the plug can be mounted in the socket and removed again from the socket without detrimental effect on further mounting in and release of the plug and the socket. Exemplary complementary connection means comprise an external helical thread and an internal helical thread; a magnet and a ferromagnetic material; magnets arranged with the north pole of one magnet facing the south pole of another magnet; a press-fit arrangement, a form-fitting connection, male-female interactions, spring-lock interactions, click-lock interactions, etc., or any combination of these.

The bottom connection element of the plug has a bottom contact interface, and the top connection element of the plug has a top contact interface. The bottom contact interface and the top contact interface are configured to establish an electrical connection to the composite board. In particular, the bottom contact interface can establish an electrical connection to the bottom layer, and the top contact interface can establish an electrical connection to the top layer. The bottom contact interface and the top contact interface may be referred to collectively as the "contact interfaces". The bottom contact interface may be any part of the bottom connection element, and the top contact interface may be any part of the top connection element. For example, the contact interfaces may be any surface of the respective connection elements, which will be put in contact with the respective electrically conducting layer, when the plug is mounted in the socket to thereby establish an electrical connection between the contact interface and the corresponding electrically conducting layer. It is however also contemplated that the connection elements may comprise additional components, e.g., cables, wires, metal pieces, etc., for establishing the electrical connection. In a specific example, one or both of the connection elements comprise a coupling portion providing the complementarity to the respective connection site as well as being configured to establish an electrical connection between the respective connection element and electrically conducting layer. In another specific example, one or both of the connection sites comprise a coupling portion providing the complementarity to the respective connection elements as well as being configured to establish an electrical connection between the respective connection element and electrically conducting layer. When the socket has a round shape, the coupling portion is at the connection site(s) and may have a helical thread and the bottom connection element, and optionally also the top connection element, may have a complementary helical thread so that the plug can be screwed into the socket. In general, when the socket of the composite board comprises coupling portions, the coupling portions are typically sized to contain the coupling means of the pair of complementary connection means of the coupling portion and the bottom connection element and the top connection element, respectively. Thus, the coupling portion of the socket may extend beyond the thickness of the electrically conducting material(s) of the composite board. However, the coupling portion, regardless of its extension relative to the thickness of the electrically conducting material(s) of the composite board, is preferably flush with the surface of the composite board. For example, the coupling portion may have a dimension in the direction of the thickness of the composite board in the range of 1 mm to 3 mm, e.g., 1.5 mm to 2.5 mm. Thus, the coupling portion may extend 1 mm to 3 mm from the surface of the composite board and into the insulator.

The bottom connection element and the top connection element may be made from any material. For example, the bottom connection element and the top connection element may be made from an electrically conducting metal. The electrically conducting metal of the bottom connection element and the top connection element may be selected based on the materials of the electrically conducting layers. For example, the electrically conducting layers may be made from aluminium, titanium or magnesium, e.g., both the top layer and the bottom layer may be made from the same metal, e.g., aluminium, and the bottom connection element and the top connection element may be made from another metal. For example, both of the electrically conducting layers may be made from the same metal, e.g., aluminium, titanium or magnesium, and the bottom connection element and the top connection element may be made from the same metal or another metal. Exemplary metals are aluminium, titanium, magnesium, chromium, nickel, copper, noble metals and alloys, e.g., stainless steel, brass, bronze. In a specific example, the bottom connection element and/or the top connection element are made from nickel coated brass.

In an example, the socket extends through the top layer, which is the front layer, and through the insulator, and the bottom layer provides an opposite surface opposite the exterior surface of the composite board. The opposite surface in the bottom layer may represent the bottom connection site of the socket, or the bottom connection site may be any section of the opposite surface in the bottom layer. For example, the bottom layer may comprise a hole, e.g., a hole aligned with any part of the socket, through the bottom layer, and the bottom connection site may be the perimeter of the hole. The top connection site may comprise an internal helical thread, and the top connection element may comprise an external helical thread, or the top connection element may be configured to be press-fitted with the top connection site, thus representing the top complementary connection means. The bottom complementary connection means comprises a bottom surface of the bottom connection element and the opposite surface in the bottom layer, and the bottom connection is a contact between the bottom surface of the bottom connection element and the opposite surface in the bottom layer. Thus, an electrical connection is established when the plug is mounted in the socket.

The plug comprises an assembly component that separates the bottom connection element from the top connection element. In particular, the assembly component provides electrical insulation between the bottom connection element and the top connection element. The assembly component may be made from any electrically insulating material.

In a specific example, the assembly component is connected to the bottom connection element and/or to the top connection element by a form-fitting connection. The form-fitting connection may be a permanent engagement means. In the present context, permanent engagement means that the removal of the assembly component from the top connection element or from the bottom connection element requires the destruction of the plug.

The assembly component may comprise engagement means for engaging complementary engagement means of the bottom connection element and/or the top connection element. The engagement means between the assembly component and the bottom connection element, or the top connection element may allow releasable engagement between the assembly component and the bottom connection element or the top connection element or the engagement means may allow permanent engagement. For example, the assembly component and the bottom connection element and/or the assembly component and the top connection element may have complementary helical threads, a press-fit arrangement, male-female interactions, spring-lock interactions, click-lock interactions, gluing, welding or a combination of these. In a specific example, the assembly component is made from a thermoplastic polymer and comprises one or more pins also made from a thermoplastic polymer protruding in the direction of the bottom connection element and/or the top connection element, which bottom connection element and/or which top connection element have holes aligned with the pins protruding from the assembly component. Once the assembly component and the top connection element, the assembly component and the bottom connection element or the assembly component, the top connection element and the bottom connection element are assembled, the pins are heated to melt the thermoplastic polymer and subsequently cooled to re-solidify the thermoplastic polymer and thereby secure the assembly component to bottom connection element and/or the top connection element, as appropriate. In the context of the disclosure, assembly of the component by melting pins of a thermoplastic polymer is considered a form-fitting connection.

The form-fitting connection may also be a non-permanent engagement means. In the present context, non-permanent engagement means that the corresponding components, e.g., the assembly component, the bottom connection element and the top connection element, may be fitted together to provide the form-fitting connection, e.g., a press-fit arrangement, and may subsequently be separated from each other without affecting future re-assembly of one, two or all three of the corresponding components to thereby allow recycling of the components. For example, the bottom connection element and the top connection element may be made from a metal, and the assembly component may be made from a polymer, e.g., a flexible polymer, and the assembly component may have a pin, e.g., a locking pin, extending from a surface facing the bottom connection element or the top connection element where a complementary hole is located so that by assembly of the assembly component with the bottom connection element or the top connection element, as appropriate, the pin will engage the complementary hole. The flexibility of the polymer material of the assembly component allows that a tight fit is obtained between the assembly component and the appropriate connection element, while still allowing disassembly of the assembly component from the appropriate connection element and allowing recycling of the components. Correspondingly, the pin may also be located on a surface of the bottom connection element, or the top connection element and the complementary hole may be located on the assembly component. Thus, either or all of the assembly component, the bottom connection element and the top connection element may comprise a pin, e.g., a locking pin, for engaging with a complementary hole being located in the surface of the opposite component, and either or all of the assembly component, the bottom connection element and the top connection element may comprise both a pin, e.g., a locking pin, and a complementary hole where the pin on one component can engage a complementary hole on another component. For example, the following combinations of pin-complementary hole exist assembly component-bottom connection element and assembly component-top connection element, and likewise the following combinations of complementary hole-pin exist assembly component-bottom connection element and assembly component-top connection element. A component having a pin may have any number of pins, e.g., 2 to 8 pins, and the component having the complementary hole(s) may have the same number of complementary holes as the number of pins, e.g., 2 to 8 complementary holes. When a component has a plurality of pins, e.g., 2 to 8 pins, which extend in different directions for engaging complementary holes, the engagement with the complementary holes creates a locking effect to ensure a tight fit between the respective components where movement of the components relative to each other is prevented. Pins extending in different directions may also be referred to as "locking pins". In the context of the disclosure, assembly of the component by pins and complementary holes where either or both of the pin and the material having the complementary hole is flexible is considered a form-fitting connection.

The assembly component is generally arranged as a layer between the bottom connection element and the top connection element. Thus, for example, the plug may be a layered structure comprising the assembly component between the bottom connection element and the top connection element. A circuit board is positioned between the bottom connection element and the top connection element. When the plug comprises a layered structure with the assembly component being the middle layer between the bottom connection element and the top connection element, the circuit board may be in the same layer as the assembly component. For example, the assembly component may comprise a hole extending through the assembly component to provide space for the circuit board.

The circuit board may be any component capable of carrying the electronic component and establishing electrical connection from the bottom layer to the electronic component and electrical connection from the top layer to the electronic component. The circuit board is not limited to a "board" shape and is defined solely by the functions outlined above. In its simplest form the "circuit" of the circuit board provides electrical contacts between the electronic component and the two conducting layers, respectively. The circuit board may be any kind of material, e.g., plastic, metal etc., provided with the circuit for transmission of electricity. The circuit may be attached to the circuit board in any way, e.g., by printing, soldering, gluing or the like. In a certain example the circuit board is a printed circuit board (PCB). The circuit board has a first surface and an electrically conducting second surface, and the circuit board carries an electronic component on the first surface or the electrically conducting second surface. The first surface may also be referred to as "the front surface", and the electrically conducting second surface may also be referred to as "the back surface". The first surface will generally face the exterior surface of the composite board. The circuit board comprises any electrical wires, vias or the like, for the electronic component to be electrically connected with the bottom layer and the top layer, and thereby provide an electric current to the electronic component, when the plug is mounted in the socket.

The bottom connection element has a bottom inner surface, and the top connection element has a top inner surface. The bottom inner surface may be any surface of the bottom connection element that is available for establishing an electrical connection between the electrically conducting second surface of the circuit board and the bottom connection element. The top inner surface may be any surface of the top connection element that is available for establishing an electrical connection between the first surface of the circuit board and the top connection element.

The bottom inner surface is in electric connection, e.g., in contact, with the electrically conducting second surface. Thereby, an electrical connection is established between the bottom inner surface and the electrically conducting second surface. The electric connection may be selected freely, and the contact may be a direct contact between the bottom inner surface and the electrically conducting second surface, or the contact may be made via any electrically conducting component. In the context of the present disclosure "direct contact" means that there are no further components between the bottom inner surface and the electrically conducting second surface.

The electrically conducting second surface may be defined by a surface area, in particular a surface area of an electrically conducting material, e.g., a metal, such as gold, platinum, silver, nickel, or their mixtures, combinations and alloys, and up to 100% to the surface area may be in contact with the bottom inner surface. In general, a section of the electrically conducting second surface not represented by the electrically conducting material is not included in the "surface area". The bottom inner surface may generally also have an electrically conducting surface. The electrically conducting surface of the bottom inner surface may be larger than the surface area of the electrically conducting second surface so as to ensure that 100% of the surface area of the electrically conducting second surface may be in contact or electrical connection with the bottom inner surface. However, the surface area of the electrically conducting surface of the of the bottom inner surface may also be smaller than the surface area of the electrically conducting second surface. For example, when at least 2% of the surface area of the electrically conducting second surface is in contact or electrical connection with the bottom inner surface, this contact is considered sufficient to establish the electrical connection.

In general, the bottom inner surface and the electrically conducting second surface have complementary shapes to allow as large a fraction of the surfaces to be in contact. The bottom inner surface and the electrically conducting second surface may be considered to represent opposite inner surfaces. The complementary shapes may be selected freely, and in the context of the present disclosure the shapes of the bottom inner surface and the electrically conducting second surface are considered complementary when any part of the surface area of the electrically conducting second surface has a perpendicular distance to the bottom inner surface in the range of 0 μm to 500 μm. Exemplary complementary shapes are concave-convex, planar-planar, internal helical thread-external helical thread, etc.

It is preferred that both of the bottom inner surface and the electrically conducting second surface are planar. When the bottom inner surface and the electrically conducting second surface are planar, a more compact plug is available compared to when the shapes of the bottom inner surface and the electrically conducting second surface deviate from planar. It is particularly preferred that the bottom inner surface and the electrically conducting second surface are planar, and that the electrical connection between the bottom inner surface and the electrically conducting second surface is made by directly contacting the bottom inner surface with the electrically conducting second surface. For example, the distance between the electrically conducting second surface and the bottom inner surface, e.g., the perpendicular distance from any point in the surface area of the electrically conducting second surface to the bottom inner surface, may be in the range of 0 μm to 300 μm, e.g., 0 μm to 100 μm.

Electronic components generally generate heat, and the heat should be removed to increase the lifetime of the electronic component. In the present context, thermal conduction between the bottom inner surface and the electrically conducting second surface may be provided using a thermal paste. When a thermal paste is located between the bottom inner surface and the electrically conducting second surface, the plug also comprises an electrical conductor to provide electrical connection between the bottom inner surface and the electrically conducting second surface. The electrical conductor may be selected from a cable, a wire, and a metal piece. In a specific example, the electrical conductor is a metal piece, e.g., a spring element, which provides a contact, as rated in Pa (or $N/m^2$), between the bottom inner surface and the electrically conducting second surface of at least 1 MPa, e.g., at least 10 MPa.

In an example, the plug comprises an electrically conducting glue between the first surface and the top inner surface and/or between the electrically conducting second surface and the bottom inner surface. However, when the respective inner surface, i.e., the top inner surface or the bottom inner surface, is made from a passive metal, the naturally formed oxide layer on the passive metal will generally prevent an electrical contact between the electrically conducting glue and the respective inner surface. Thus, in an example, the top inner surface is made from a passive metal, e.g., aluminium, titanium, or magnesium, and the plug does not comprise an electrically conducting glue between the top inner surface and the first surface of the circuit board. In another example, the bottom inner surface is made from a passive metal, e.g., aluminium, titanium, or magnesium, and the plug does not comprise an electrically conducting glue between the bottom inner surface and the electrically conducting second surface of the circuit board.

In an example of the plug, the electrically conducting second surface has a surface area and 2% to 100% of the surface area is connected to the bottom inner surface by soldering. The solder employed may be any solder known in the art of soldering electronic components, e.g., a solder having a melting point, especially a eutectic melting point, below 300° C. For example, the soldering may be performed in an automated soldering machine, e.g., a wave soldering machine. When the electrically conducting second surface is soldered to the bottom inner surface, the electrically conducting second surface preferably has a surface area comprising an electrically conducting material, e.g., a metal, such as gold, platinum, silver, nickel, or their mixtures, combinations and alloys, which electrically conducting material is electrically connected to vias in the circuit board to allow establishing electrical connections between the bottom connection element and the electronic component carried on the circuit board. For example, the whole surface or any fraction of the electrically conducting second surface may comprise the electrically conducting material.

When the bottom inner surface and the electrically conducting second surface are connected by soldering, the bottom inner surface and the electrically conducting second surface may have any complementary shapes, although preferred complementary shapes are concave-convex and planar-planar. Regardless of the complementary shapes, the soldering allows that the distance between the bottom inner surface and the electrically conducting second surface can be minimised. For example, the soldering allows that the distance between the bottom inner surface and the electrically conducting second surface, e.g., the perpendicular distance from any point in the electrically conducting second surface to the bottom inner surface, is up to 300 μm, e.g., in the range of 20 μm to 100 μm. In particular, the soldering can replace a spring element between the bottom inner surface and the electrically conducting second surface. Thus, in an example, the bottom inner surface and the electrically conducting second surface are connected by soldering, and the plug does not comprise a spring element between the bottom inner surface and the electrically conducting second surface. Furthermore, when the bottom inner surface and the electrically conducting second surface are both planar and soldered together, a particularly compact plug is obtained, especially when the plug also does not comprise a spring element between the bottom inner surface and the electrically conducting second surface.

The present inventor has surprisingly found that when at least 2% of the surface area of the electrically conducting second surface is soldered to the bottom inner surface, the solder provides sufficient thermal conductivity for the bottom connection element to serve as a heat sink so that the solder provides thermal connection between the electronic component and the bottom connection element. The larger the fraction of the surface area of the electrically conducting second surface that is soldered to the bottom inner surface, the more efficient the transfer of heat from the electronic component, but in general, a sufficient heat transfer is obtained when at least 2% of the surface area of the electrically conducting second surface is soldered to the bottom inner surface. In other examples, at least 5%, e.g., at least 10%, at least 20%, at least 30%, at least 40%, or at least 50% of the surface area of the electrically conducting second surface is soldered to the bottom inner surface. The efficient heat transfer of the solder allows that no further heat conducting components are necessary between the electronic component and the bottom connection element. Thus, in further examples, at least 2% of the surface area of the electrically conducting second surface is soldered to the bottom inner surface, and the plug does not comprise a heat conducting component, e.g., a thermal paste, silicon carbide, or the like, between the bottom inner surface and the electrically conducting second surface.

By soldering the electrically conducting second surface to the bottom inner surface, e.g., when at least 2% of the surface area of the electrically conducting second surface is soldered to the bottom inner surface, the thermal and electrical conduction provided by soldering removes the need for additional components, especially a thermal paste and an electrical conductor. Thus, it is particularly preferred that the plug does not comprise a thermal paste between the bottom inner surface and the electrically conducting second surface, that the plug does not comprise a metal piece, in particular of a flat annular shape with teeth between the bottom inner surface and the electrically conducting second surface, and that at least 5%, e.g., at least 10%, at least 20%, at least 30%, at least 40%, or at least 50% of the electrically conducting second surface is soldered to the bottom inner surface. By not having a thermal paste and an electrical conductor between the bottom inner surface and the electrically conducting second surface a more compact and stable plug is also provided.

In a specific example, the bottom inner surface, e.g., a planar bottom inner surface, is provided with one or more indents and/or trenches, and at least 20%, at least 30%, at least 40%, or at least 50% of the electrically conducting second surface is soldered to the bottom inner surface. The indents and trenches collect the molten solder to thereby control the location of the soldering relative to the electrically conducting second surface and the bottom inner surface. The indents and trenches are defined by their depths and dimensions in the bottom inner surface. For example, the indents and trenches may have a depth in the range of 25 µm to 500 µm, e.g., 100 µm to 200 µm. An indent is generally defined as having a length and a width in the bottom inner surface where the length is up to about 200% of the width, and a trench has a length in the bottom inner surface, which is above 200% of the width. For example, an indent may be round or rectangular and have a dimension, e.g., a width, of up to 3 mm. For example, the indent may be round and have a diameter in the range of 100 µm to 2.5 mm, e.g., 0.5 mm to 2 mm, or the indent may be rectangular and have a width in the range of 100 µm to 2.5 mm and a length in the range of 100 µm to 2.5 mm. A trench may have any shape as desired, e.g., a line or curve, and have a width in the range of 50 µm to 100 µm and a length of at least 100 µm and up to 1000 µm or more. It is also possible for two or more trenches to cross each other in the bottom inner surface. The bottom inner surface may be described in terms of the area of the indents and trenches in the bottom inner surface. For example, the area of the indents and trenches may be in the range of 1% to 50%, e.g., 5% to 40% or 10% to 30%, of the area of the bottom inner surface. When the bottom inner surface has indents and/or trenches, in particular when the area of the indents and trenches is in the range of 5% to 25% of the area of the bottom inner surface, the indents and trenches provide a simple way to ensure that up to 100%, e.g., at least 80% or about 100%, of the surface area of the electrically conducting second surface is connected to the bottom inner surface by soldering without further means to control the molten solder in the soldering step. For example, the molten solder may be applied to the bottom inner surface in the vicinity of the indents/trenches so that upon contact with the electrically conducting second surface, excess molten solder will be pushed into the indents/trenches and thereby provide a simplified way to ensure a large soldered contact surface between the bottom inner surface and the electrically conducting second surface. It is also possible to apply the molten solder in the indents and/or trenches. Thereby, the percentage of soldered contact between the bottom inner surface and the electrically conducting second surface, e.g., corresponding to the area of the indents and trenches in the bottom inner surface, can be easily controlled. It is also possible to apply molten solder in some or all of the indents and/or trenches and also in the vicinity of the indents and/or trenches.

Removal of heat from the electronic component is especially relevant when the electronic component is an LED, and the soldering is preferred when the electronic component is an LED. When the electronic component is an LED, the bottom connection element may be cathodic or anodic, since this will allow the bottom connection element to serve as a heat sink and the heat conducting effect of the soldering is used more efficiently.

In a specific example, at least 2% of the surface area of the electrically conducting second surface is soldered to the bottom inner surface, and the plug does not comprise a spring element or a heat conducting component, e.g., a thermal paste, silicon carbide, or the like, between the bottom inner surface and the electrically conducting second surface.

The heat transfer effect of the solder is particularly pronounced when the surface area of the electrically conducting second surface is represented by an electrically conducting material, e.g., a metal, such as gold, platinum, silver, nickel, or their mixtures, combinations and alloys, e.g., when the electrically conducting second surface is coated by the electrically conducting material, and when the circuit board has vias through the circuit board to provide electrical connections from the electrically conducting second surface to the electronic component. In an example, the circuit board is an aluminium plate or a copper plate and the electrically conducting second surface is coated with a metal selected from gold, platinum, silver, nickel, and their mixtures, combinations, or alloys, e.g., an aluminium circuit board may be coated with nickel, which in turn is coated with gold. The aluminium circuit board may comprise vias through the circuit board. The aluminium has good thermal conductivity so that the aluminium circuit board will work together with the heat transfer obtained by the soldering. Thus, in an example, the circuit board is an aluminium plate and the electrically conducting second surface is coated with a metal selected from gold, platinum, silver, nickel, and their mixtures, combinations and alloys, and at least 2%, e.g., at least 5%, e.g., at least 10%, at least 20%, at least 30%, at least 40%, or at least 50%, of the surface area of the electrically conducting second surface is soldered to the bottom inner surface. When the circuit board is made from aluminium, and the electrically conducting second surface is soldered to the bottom inner surface, the heat transfer away from the electronic component, in particular an LED, is about 10 times more efficient that the heat transfer available from a thermal paste between the electrically conducting second surface and the bottom inner surface. It is especially preferred in this example that the plug does not comprise a spring element or a heat conducting component, e.g., a thermal paste, silicon carbide, or the like, between the bottom inner surface and the electrically conducting second surface. It is further preferred that the electrically conducting second surface of the circuit board has an outer surface of gold, platinum, silver, or nickel or their combinations, e.g., the electrically conducting second surface is coated with a metal selected from gold, platinum, silver, nickel, and their mixtures, combinations, and alloys. It is further preferred that the bottom inner surface and the electrically conducting second surface are both planar, and that the distance between the bottom inner surface and the electrically conducting second surface, e.g., the perpendicular distance from a point in the electrically conducting second surface to the bottom inner surface, is up to 300 µm, e.g., in the range of 20 µm to 100 µm. Thereby, a compact plug that provides removal of heat from the electronic component despite the compact size is obtained. It is especially preferred that the electronic component is an LED or a series of LEDs, e.g., an LED having a power rating of at least 1 W, e.g., 3 W to 10 W. The invention thus provides a compact and replaceable LED plug for mounting in a composite board, e.g., a component fitting system of the invention.

In an example of the plug, the plug further comprises a spring element positioned between the first surface and the top inner surface or between the electrically conducting second surface and the bottom inner surface. The spring element will be in direct contact with the respective surfaces, e.g., the first surface and the top inner surface, or the electrically conducting second surface and the bottom inner surface. The spring element may have any shape as desired. For example, the spring element may have an annular shape deviating from flat or a helical shape and be made of any resilient material. In an example, the spring element has an annular shape deviating from flat and is made from an electrically non-conducting material, e.g., a polymer. In another example, the spring element has an annular shape deviating from flat and is made from an electrically conducting material, e.g., a metal, such as a spring steel. It is preferred that the plug comprises at least one spring element, especially between the first surface and the top inner surface, e.g., an annular spring element made from a polymer or an electrically conducting metal. When components of the plug have different thermal expansion coefficients, the spring element absorbs the effect of the different thermal expansion coefficients when the temperature of the components increase due to the electricity conducted through the plug so that the spring element ensures tight contact between the components.

In general, a spring element will be made of a material, e.g., an electrically conducting metal, having a thickness in the range of 100 µm to 500 µm, and the spring element may be described in terms of an axial extension before deformation. The axial extension before deformation may be determined as the maximum height of the spring element from a flat surface when the spring element is placed on the flat surface. The axial extension before deformation will typically be in the range of 100 µm to 1 mm, e.g., 300 µm to 500 µm. Once compressed between the first surface and the top inner surface or between the electrically conducting second surface and the bottom inner surface the spring element will have a compressed thickness, which may correspond to the thickness of the material of the spring element. For example, the compressed thickness may be in the range of 300 µm to 500 µm.

In a specific example, the plug comprises a spring element between the first surface and the top inner surface, and the spring element has an annular shape deviating from flat and is made from an electrically conducting material. For example, the spring element may be made from brass, bronze or steel and be partly or fully coated with nickel. The spring element may have a conical or frustoconical shape, a wave shape or the like, or the spring element may have a flat annular shape with teeth extending in any direction from the flat annular shape. The spring element may have any number of teeth. For example, the spring element may have at least three teeth, e.g., a plurality of teeth, such as 6 to 24 teeth. In particular, the flat annular shape may be in contact with the first surface and the teeth may be in contact with the top inner surface. When the spring element is made from an electrically conducting metal, the spring element provides the electrical connection at a surface, which the spring element is in contact with, e.g., the electrical connection to the top inner surface or the bottom inner surface. In particular, when the spring element is made from an electrically conducting metal, e.g. bronze, brass or spring steel, and is coated with one or more of nickel, copper, silver, gold, platinum or a combination thereof, the coating provides a tight contact to the top inner surface and ensure good electrical contact between the spring element and the top inner surface, and thereby between the top connection element and the first surface of the circuit board. The spring element may for example have a plurality of teeth, e.g., from 4 to 30 teeth. The metal piece with a plurality of teeth may be made from any appropriate metal, e.g., brass or steel, and at least the contact interfaces with either or both of the bottom inner surface and the electrically conducting second surface may be coated with nickel. The metal piece may also be fully coated with nickel. A nickel coating is preferred when the bottom inner surface, the electrically conducting second surface, or both of the bottom inner surface and the electrically conducting second surface are made from aluminium.

The material of the electrically conducting layers may be chosen freely, and the electrically conducting layers may be from any conducting material. Likewise, the conducting material may have any thickness as desired. However, it is preferred that the electrically conducting material comprises or is a metal. Preferred metals are metals selected from the list consisting of aluminium, magnesium, copper, titanium, steel, and their alloys. Metals may be anodised to provide the metal with an oxide layer on the surface, and in an embodiment the metal is anodised, e.g., by providing an oxide layer having a thickness of at least 10 µm. When the metal is anodised, the outer surface of the metal is electrically insulating so that an end user is protected from currents running through the electrically conducting materials, i.e., the bottom layer and the top layer. Anodization further protects the metal from being corroded. In particular, an electric current running through the bottom layer or the top layer can make the metal more prone to corrosion but by anodising the metal such corrosion is prevented. Anodization is especially relevant when the bottom layer and/or the top layer is constructed from aluminium, magnesium or titanium, or alloys based on these metals. For example, these layers may be anodised to provide oxide layers of at least 10 μm thickness, e.g., about 20 μm $Al_2O_3$. Anodised aluminium, magnesium, or titanium has a protective insulating layer prevented short circuiting and electrical shocks.

The composite board may be extending in two dimensions so that it can be described as "planar". A planar composite board is not limited with respect to thickness, and in general the thickness is defined by the combined thicknesses of the bottom layer, the top layer and the insulator. The composite board may also be defined in three dimensions and e.g., have a shape representing a section of a sphere, e.g., a hemispherical shape, or an arch. Non-planar composite boards will also have a thickness is defined by the combined thicknesses of the bottom layer, the top layer and the insulator, and a non-planar composite board is also not limited with respect to its thickness.

The composite board may have any shape as desired as long as it comprises the at least two layers, i.e., the bottom layer and the top layer, of electrically conducting material separated by the electrically insulating material. The bottom layer and top layer are separated by an insulator of electrically insulating material. In the context of the invention the term "separate" and its derived forms mean that direct electrical contact between the bottom layer and the top layer is prevented in order to prevent short circuits between the bottom layer and the top layer. The composite board may comprise additional elements as desired in order to separate the bottom layer and the top layer, or the insulator of the electrically insulating material may be the only element separating the bottom layer and the top layer.

The size of the composite board may be selected freely. In general, the composite board has a thickness reflecting the thickness of the insulator, e.g., in the form of an electrically insulating layer, plus the two electrically conducting layers. The thickness of the composite board is typically in the range of 2 mm to 50 mm. The thickness of each of the bottom layer and the top layer of an electrically conducting material is typically, and independently, in the range of 1 mm to 3 mm. In the plug, the bottom connection element, the assembly component and the top connection element will generally be arranged as layers with the assembly component being between the bottom connection element and the top connection element. The distance between the outer surface of the bottom connection element and the top connection element may be referred to as the length of the plug. The length of the plug generally corresponds to the thickness of the composite board for which the plug is designed. The length of the plug may be in the range of 3 mm to 10 mm.

The other two dimensions, i.e., the length and the width, of the composite board typically reflect the intended use of component fitting system, e.g., as a lighting fixture, and in a certain embodiment the composite board has a size according to recognised standards. For example, the composite board/lighting fixture may be sized to fit under e.g., a kitchen cabinet or the like. Thus, the lighting fixture may have a width of about 600 mm. The length, e.g., the length for a lighting fixture to fit under a kitchen cabinet, may be adjusted by cutting a section off so that the lighting fixture fits an intended number of cabinets. For example, the length may correspond to one or two kitchen cabinets, e.g., 600 mm or 1200 mm. Similar observations are relevant for the component fitting system not in the shape of a lighting fixture. In another embodiment the component fitting system is designed to replace a copper wire for supplying electricity to electronic components, and it has a width in the range of 10 to 100 mm, e.g., 30 mm to 50 mm, such as about 40 mm. In this embodiment the present component fitting system may also be referred to as a "rail"; a rail may contain modules, i.e., the component fitting system, of a length in the range of 100 cm to 200 cm. However, the rail may also be much longer, e.g., several meters and up to 100 m or even more.

In an example the bottom layer and/or the top layer is a sheet metal with a thickness up to 5 mm. e.g., in the range of 0.3 mm to 0.7 mm, or in the range of 0.5 mm to 2.0 mm. A preferred metal for the conducting layers is aluminium, e.g., in the form of sheets with a thickness up to 5 mm, e.g., in the range of 0.3 mm to 0.7 mm, or in the range of 0.5 mm to 2.0 mm. Likewise, sheets of magnesium or titanium are also relevant, and the thickness may be up to 5 mm, e.g., in the range of 0.3 mm to 0.7 mm, or in the range of 0.5 mm to 2.0 mm. In a specific example, the bottom layer and/or the top layer is a sheet of copper, optionally coated with an electrically insulating material, e.g., lacquer or paint, on the surface opposite the surface in contact with the insulator.

In an example the bottom layer and/or the top layer has been extruded from a metal, e.g., from aluminium, magnesium, copper, titanium, or steel. Extrusion of the bottom layer and/or the top layer is advantageous, since extrusion allows preparation of a bottom layer and/or a top layer having a non-uniform thickness. In a preferred example the bottom layer and the top layer are extruded, e.g., from aluminium or magnesium, to have a cross-section in a plane normal to the longitudinal axis of the respective layer. The overall thickness of the composite board may correspond to the combined thicknesses of the bottom layer, the top layer and the thickness of the insulator, e.g., the combined thickness is in the range of 1 mm to 10 mm, e.g., 3 mm to 5 mm. In a specific example the bottom layer and the top layer are rotationally symmetrical with respect to the connecting regions relative to the normal plane. It is also possible that the bottom layer and/or the top layer are manufactured by extrusion of a polymer material, e.g., a thermoplastic polymer, which is subsequently coated with a metallic layer to make the layer electrically conducting. In particular, the metallic coating will be between the extruded polymer and the insulator in order to prevent direct contact of an end user with the electrically conducting layers.

In a further example the bottom layer and/or the top layer are plates of a metal, e.g., from aluminium, magnesium, copper, titanium, or steel, provided using any method as desired. The metal plates may be joined together using a layer of glue or a thermoplastic polymer, e.g., low density polyethylene (LDPE), as the insulator. The thermoplastic polymer may be applied in a molten form between the metal plates constituting the bottom layer and the top layer, or the thermoplastic polymer may be a plate positioned between the metal plates.

The electrically conducting layers are separated by an insulator. The insulator may have any form desired and the electrically insulating material may be any electrically insulating material. In particular, the insulator may form a layer between the electrically conducting layers, and the insulator may also be referred to as an "electrically insulating layer". The assembly component is preferably also made from an electrically insulating material, and any electrically insulating material is contemplated for the assembly component. In the present context, the term "electrically insulating material" may refer to the material of the insulator and/or the material of the assembly component. The electrically insulating material of the insulator may be the same as the electrically insulating material of the assembly component, or the assembly component may be made from a different electrically insulating material than the insulator. The electrically insulating material may comprise a flame retardant. The electrically insulating material is preferably a polymeric material. For example, the electrically insulating layer and/or the assembly component may be made of a polymer material such as amorphous plastic materials (e.g., LDPE, polyvinylchloride, polycarbonate and polystyrene) or crystalline plastic materials (e.g., Nylon, polyethylene and polypropylene), or wood.

The electrically insulating material, especially for the insulator, may be of low density. For example, the electrically insulating material may comprise an expanded or foamed material (open and/or closed celled), such as expanded polystyrene, and/or a reinforced material such as a fibre glass material. In a certain example the electrically insulating material is polyethylene or the like. For example, the insulator may have a thickness of at least 0.2 mm, e.g., in the range of 1 mm to 6 mm, e.g., 3 mm or 5 mm. A specific composite board is marketed as a Dibond® plate. When the electrically insulating layer is made from wood it will generally be thicker, e.g., in the range of 10 mm to 20 mm. In a certain example the insulator comprises several different materials. It is significant that the insulator separates the bottom layer from the top layer in order to prevent short circuits, and it is possible that the insulator comprises an electrically conducting material as long as the bottom layer is separated from the top layer. For example, the insulator may comprise a core of a different material, even a metal, providing strength and rigidity. In a further example the insulator comprises materials of different thermal expansion coefficients so that assembly of the insulator under increased temperature can provide a material of greater rigidity than expected from the individual materials.

In an example the insulator has the form of a sheet between the bottom layer and the top layer, which may also be in the form of sheets, or which may be extruded to have another form. When the insulator has the form of a sheet its area generally corresponds to at least 50% of the area of the bottom layer and/or the top layer. The insulator may also define a honeycomb structure or another discontinuous structure. For example, the insulator may take the form of a plurality of pillars or the like between the bottom layer and the top layer. A plurality of pillars is especially preferred when the electrically conducting layers have been extruded.

In an example the bottom layer and the top layer, which may be extruded metals, are glued together with an electrically non-conducting glue so that the glue is the insulator. This allows a thinner layer of the insulator, e.g., in the range of 0.2 mm to 1 mm, e.g., 0.3 mm to 0.7 mm, since the insulator can be applied in a liquid form, e.g., at ambient temperature, so that the total thickness of the component fitting system is thinner than can be achieved using a solid material as insulator. It is preferred when the insulator is a glue that the socket for the plug is made in the bottom layer or the top layer as desired before gluing the electrically conducting layers together. In further examples, the thickness of the insulator layer is in the range of 1 mm to 10 mm, e.g., 3 mm to 7 mm.

The electronic component may be chosen freely, and for example the electronic component may be an LED or a series of LEDs. The "electronic component" is not limited to one component and further it is not limited to LEDs. For example, the electronic component may be selected from the list consisting of LEDs, a series of LEDs, a resistor, a transistor, a controller, a chip on board (COB), a driver, a microphone, a camera, a sensor, e.g., a sensor for temperature or humidity, etc., a radio transmitter, a radio receiver, an antenna, an access point for wireless communication, e.g. WiFi, LiFi, Bluetooth, etc. The electronic component, in particular LEDs, preferably has the form of a surface mounted device (SMD). The plug of the disclosure is releasable in the socket of the component fitting system, and a plug having one type of electronic component can readily be replaced with another plug having another type of electronic component. In particular, the component fitting system may have a power supply providing a standard voltage, e.g., a standard DC, to the electrically conducting layers, e.g., 12 V or 24 V, so that a plug having an electronic component operating under the standard current can be chosen freely for the component fitting system.

A preferred electronic component is an LED or a series of LEDs, and when the plug comprises LED, the component fitting system may also be referred to as a lighting fixture. LEDs, or other electronic components, may be electrically serially connected on the circuit board. The lighting fixture may have any number of plugs. When the component fitting system comprises a plurality of plugs with LEDs or series of LEDs it is preferred that the power supply provides a constant voltage. In other examples, the power supply provides a constant current.

Thus, in a series of LEDs the LEDs are electrically serially connected on the circuit board. The LED may be any LED as desired. For example, the LED may provide light of a specific colour, or the LED may provide white light, e.g., of a colour temperature in the range of 1,500 K to 8,000 K. In other examples, the LEDs provide light of specific wavelengths or ranges of wavelengths. For example, the light may be intended for growing plants and the LEDs may be selected to have the optimal wavelength or range of wavelengths for the specific plant. In further examples, the LEDs provide UV light, e.g., UV-A, UV-B or UV-C light. UV light is appropriate for sterilisation and disinfection. A plug of the disclosure with white LEDs typically provides a luminous intensity in the range of from 50 lumen to 500 lumen, although the disclosure is not limited to plugs providing luminous intensities in this range. When the electronic component comprises other entities than an LED these may be connected as desired, e.g., in series or in parallel with the LED or LEDs. An LED has a forward voltage ($V_f$) that is needed to power the LED and turn it on. In the context of the invention the electronic component is considered to have a combined forward voltage ($V_f$) for all components on one circuit board. Each plug in a component fitting system of the disclosure generally has electronic components of the same nominal forward voltage ($V_f$). The forward voltage ($V_f$) may also be referred to as the threshold voltage. It is preferred that the electronic component comprises a series of 2 to 10 LEDs. In an example each electronic component comprises a series of 2 to 10 serially connected LEDs with a power rating in the range of 0.1 W to 1.0 W. In a specific example, each electronic component comprises 2 to 6, e.g., 4, serially connected LEDs with a power rating in the range of 0.2 W to 0.4 W. However, it is preferred that the LEDs have a power rating higher than 1 W, e.g., in the range of 3 W to 10 W, or even higher than 10 W. High power LEDs are especially relevant for the present plug and component fitting system, since the plug allows easy replacement of individual LEDs.

The present component fitting system, e.g., a lighting fixture, may comprise a power supply capable of providing a constant voltage, i.e., a DC, between the electrically conducting layers. Alternatively, the power supply is capable of providing a constant current. The power supply may be connected to the component fitting system as desired. For example, the power supply may be wired to the bottom layer and the top layer at any location on the composite board. The constant voltage is generally higher than the forward voltage ($V_f$) of the electronic components of the plug. Thereby it is ensured that the power supply can power the electronic component. The constant voltage may be chosen freely depending on the forward voltage ($V_f$) of the electronic components. It is preferred to employ standardised constant voltages, e.g., 12 V or 24 V. It is further preferred that the electronic components of circuit boards have a forward voltage ($V_f$) in the range of 60% to 100% of the constant voltage of the power supply. For example, the electronic component may be a series of 4 LEDs with a nominal $V_f$ of about 3 V so that the combined $V_f$ of the electronic component will be about 12 V.

In a specific example the electrically conducting layers may be used to provide data communication with the electronic component using direct power line communication (PLC). When data communication is desired, the composite board may be fitted with appropriate data ports, e.g., standardised ports, such as those known as USB, HDMI, Display Port, etc. When data ports are included, appropriate electronic components will typically also be integrated in the composite board. Data ports may be included in the component fitting system.

When the component fitting system is a lighting fixture, the lighting fixture may further comprise a light processing layer on top of the socket. The light processing layer may be a polymer panel or film, such as an opalised acrylic panel/film, a clear acrylic panel/film, an acrylic prismatic panel/film, a transparent or semi-transparent coloured panel/film, a lens and/or an acrylic lens panel. The light processing layer may also be made from glass. In particular, the light processing layer may be selected based on the wavelength of light of the LED to have optimal transparency to the corresponding light. For example, the light processing layer may be transparent to UV light or to infrared (IR) light. The panel or film protects the electronic component e.g., from water and/or scatter and/or diffuse and/or focus light emitted from the electronic component. This is advantageous when the lighting fixture is for outdoor use or is a ceiling panel where a particular kind of light is desired for different applications such as lighting for office work, hallway lighting, operating room lighting etc. In a specific example the plug comprises a sealing making the lighting fixture watertight, especially when the lighting fixture also comprises a light processing layer. A sealing may also be employed in the component fitting system of the invention.

The sockets can be positioned freely on the surface of the composite board, since the layers of conducting material supply power to the electronic components. Especially when the electrically conducting layers are metallic the resistance between plugs will be insignificant regardless of the distance between the plugs. Thus, the positioning of the socket and thereby the plugs on the composite board is independent of electrical wiring or specific positions on a circuit board. For example, the sockets may be positioned at regular intervals, e.g., with a distance between the sockets in the range of from 25 mm to 1000 mm, e.g., about 100 mm or 200 mm. When the sockets are positioned close to each other, e.g., at a distance of 25 mm or less it is possible to obtain a very high luminous intensity when the plugs contain LEDs. A component fitting system with a large distance, e.g., 500 mm or more, between the sockets can also take advantage of the flexibility described above-in particular the lack of individual wiring is an advantage for component fitting systems having a distance between the sockets at 500 mm or more. Likewise, the distance between the sockets may also be smaller, e.g., in the range of 100 mm to 300 mm, such as about 200 mm.

It should be understood that combinations of the features in the various examples and aspects are also contemplated, and that the various features, details and examples may be freely combined into other examples. In particular, it is contemplated that all definitions, features, details, and examples regarding the plug and the component fitting system apply equally to one another. In particular, any feature mentioned in the context of the plug is equally relevant for the component fitting system, especially when the respective modules comprise an LED or a series of LEDs.

Reference to the figures serves to explain the invention and should not be construed as limiting the features to the specific examples as depicted.

BRIEF DESCRIPTION OF THE DRAWINGS

In the following the invention will be explained in greater detail with the aid of an example and with reference to the schematic drawings, in which.

Figure 1:
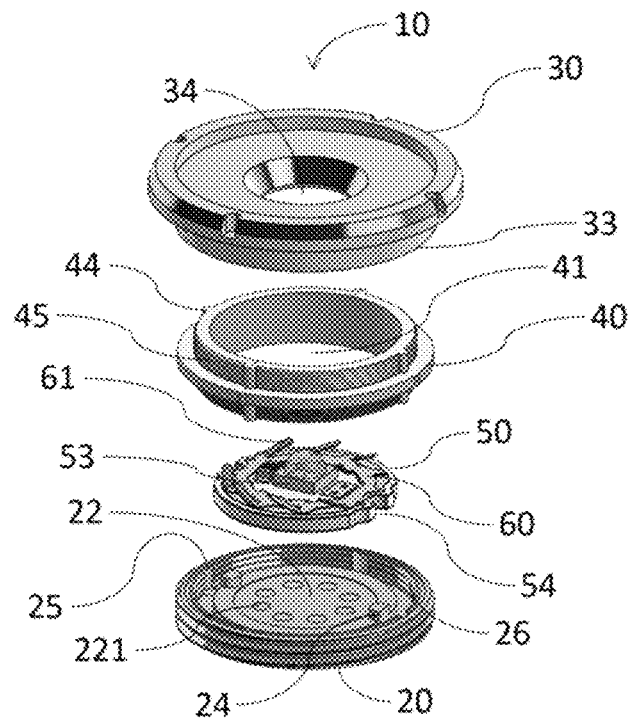
FIG. 1 shows an exploded top view of a plug of the disclosure.

The invention is not limited to the example/s illustrated in the drawings. Accordingly, it should be understood that where features mentioned in the appended claims are followed by reference signs, such signs are included solely for the purpose of enhancing the intelligibility of the claims and are in no way limiting on the scope of the claims.

DETAILED DESCRIPTION

The present invention relates to a plug for mounting in a socket of a composite board and to a component fitting system comprising the plug. The invention is illustrated in two exemplary embodiments.

Example 1

Figure 2:
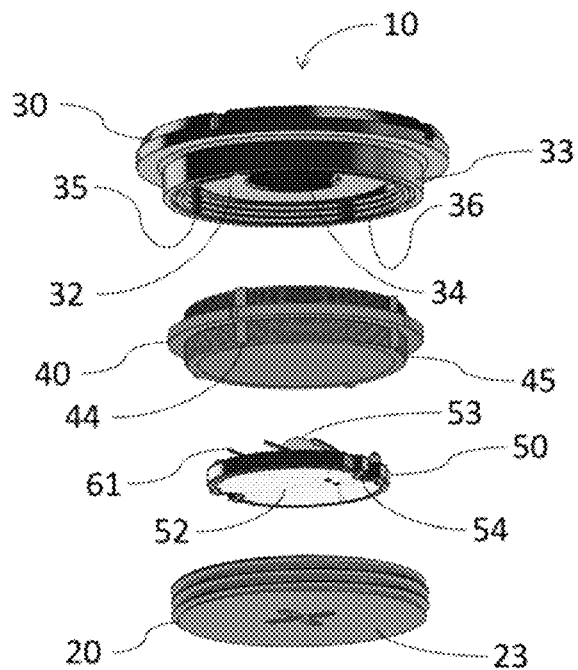
FIG. 2 shows an exploded bottom view of a plug of the disclosure.

A plug 10 of the invention as illustrated in FIG. 1 and FIG. 2 was constructed from a bottom connection element 20, a circuit board 50, an assembly component 40 and a top connection element 30. Specifically, the bottom connection element 20 and the top connection element 30 were made from nickel coated brass, and the assembly component 40 was made from polyethylene (PE). The bottom connection element 20 was the anode and the top connection element 30 was the cathode. The electronic component 53 of the plug 10 was a light emitting diode (LED) with a power rating of 5 W and capable of providing white light having a colour temperature of about 3,000 K.

The components of the plug 10 were round, and the assembly component 40 had a general ring shape, thus having a hole 41, to contain the circuit board 50 and assemble the bottom connection element 20 and the top connection element 30 while keeping the bottom connection element 20 and the top connection element 30 electrically insulated from each other.

In order to align the circuit board 50 on the bottom inner surface 22, the bottom connection element 20 contained two alignment protrusions 24 in the bottom inner surface 22, which matched two alignment notches 54 in the circuit board 50. The assembly component 40 also had alignment protrusions 44, and the bottom connection element 20 and the top connection element 30 had alignment notches 25, 35 to align with the alignment protrusions 44 of the assembly component 40. Specifically, the assembly component 40 had four alignment protrusions 44 to align with four alignment notches 25 of the bottom connection element 20 and four alignment protrusions 44 to align with four alignment notches 35 of the top connection element 30. For the plug 10 depicted in FIG. 1 and FIG. 2 there were four sets of alignment protrusions 44 and complementary alignment notches 25,35, and the alignment protrusions 44-alignment notches 25,35 were distributed evenly in the perimeter of the circles defined by the respective components. Likewise, the two alignment protrusions 24 in the bottom inner surface 22 matched two alignment notches 54 in the circuit board 50, which were placed opposite each other in the perimeter of the circles defined by the bottom connection element 20 and the circuit board 50. However, alignment notches and complementary alignment protrusions may be located anywhere in the perimeter of the respective component, which is not limited to be round.

Figure 3:
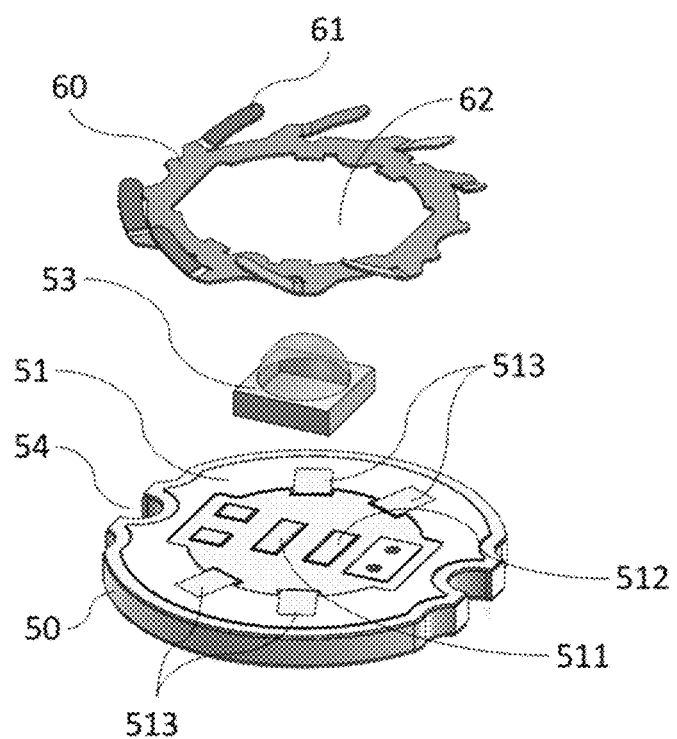
FIG. 3 shows an exploded top view of circuit board of a plug of the disclosure.

The circuit board 50 is illustrated further in FIG. 3 and was an aluminium circuit board of a thickness of about 1.5 mm and having a first surface 51 with an anodic connection point 511 and a cathodic connection point 512. The circuit board 50 had a round shape with a diameter of 17 mm. An electronic component 53, in this case an LED, was mounted on the first surface 51 with the anode of the electronic component 53 being in electrical contact with the anodic connection point 511, and the cathode of the electronic component 53 being in electrical contact with the cathodic connection point 512. The anodic connection point 511 was electrically connected to the electrically conducting second surface 52 through vias (not shown). The first surface 51 further comprised electrical connection sites 513, which were electrically connected to the cathodic connection point 512. The electrical connections are not shown in FIG. 3. Thus, the circuit board 50 contained cathodic electrical connection sites 513 and anodic vias (not shown), but in general either one of the anodic connection point 511 and the cathodic connection point 512 may be electrically connected to the electrically conducting second surface 52 and the electrical connection sites 513 may be anodic or cathodic as appropriate for the electronic component 53.

The plug further comprised a spring element 60 positioned between the first surface 51 of the circuit board 50 and the top inner surface 32 of the top connection element 30. The spring element 60 was made from a nickel coated spring stainless steel, although other materials and metals may also be used. The spring element 60 provided electrical contact between the electrical connection sites 513 and the top inner surface 32. Specifically, the spring element 60 had a flat annular shape with a hole 62 and eight teeth 61 extending toward the top inner surface 32. However, the spring element 60 may have any number of teeth 61.

The top connection element 30 contained a hole 34 aligned with the electronic component 53 on the circuit board 50 to allow light from the electronic component 53, i.e., the LED, to exit the plug 10 through the hole 34. When the electronic component 53 is an LED, the plug 10 may further comprise a light processing layer, but the embodiment depicted in FIG. 1 to FIG. 3 does not have a light processing layer. Likewise, other electronic components 53 than LEDs may not need the hole 34.

The electrically conducting second surface 52 was soldered to the bottom inner surface 22 of the bottom connection element 20. The bottom inner surface 22 contained eight indents 221 to collect the molten solder and control the location of the soldering. The indents 221 had a diameter of about 10% of the diameter of the circuit board 50 so that the surface area of the eight indents 221 represented about 8% of the surface area of the bottom inner surface 22. The indents 221 had a depth of about 100 μm. Specifically, bottom connection elements 20 were applied in an automated soldering machine, which applied molten solder to the bottom inner surface 22, and the automated soldering machine placed circuit boards 50 on the molten solder on the bottom inner surface 22. When the circuit boards 50 were pressed against the bottom inner surface 22 with molten solder, the indents 221 provided an equal distribution of the solder, which hardened so that about 50% of the surface area of the bottom inner surface 22 was soldered to the bottom inner surface 22.

The assembly component 40 was placed on the bottom inner surface 22, and the bottom connection element 20, the assembly component 40 and the top connection element 30 were connected by press-fitting. Specifically, the surfaces of the assembly component 40 facing the surfaces of the top connection element 30 and the bottom connection element 20, and the surfaces of the top connection element 30 and the bottom connection element 20 facing the surfaces of the assembly component 40 had grooves 26,36,45 where the flexibility of the PE material of the assembly component 40 allowed that once the bottom connection element 20, the assembly component 40 and the top connection element 30 were pressed together, the grooves 26 engaged the grooves 45, and the grooves 36 engaged the grooves 45 to thereby ensure press-fitting of the bottom connection element 20, the assembly component 40 and the top connection element 30.

Figure 4:
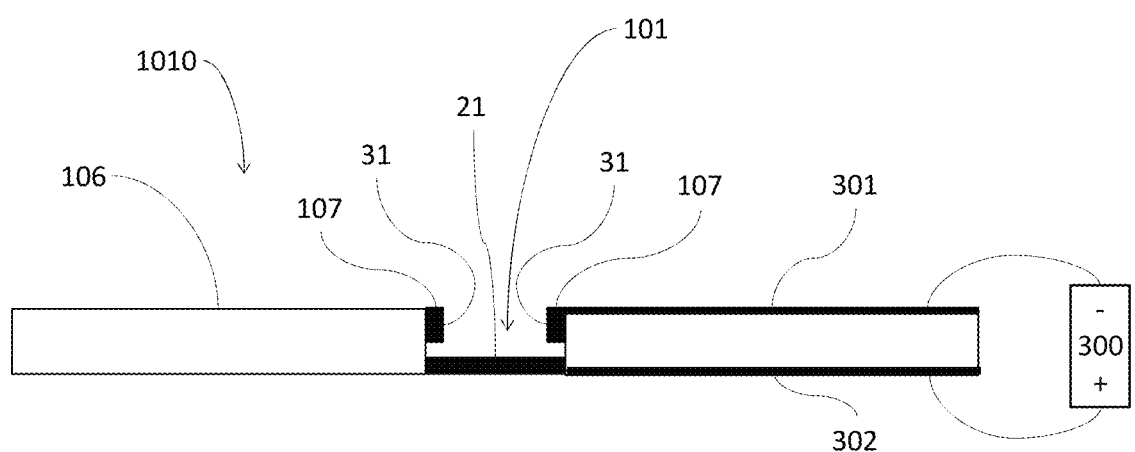
FIG. 4 shows a side view substrate for housing a plug of the disclosure.
Figure 5:
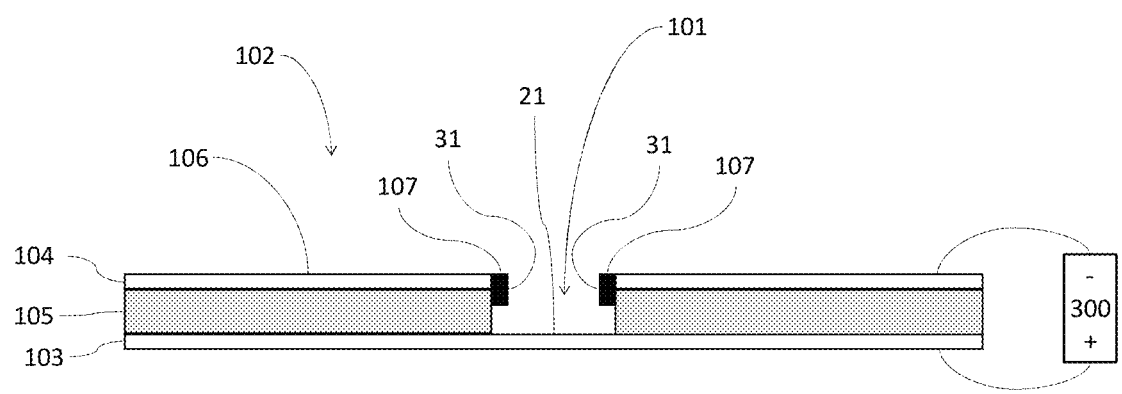
FIG. 5 shows a side view component fitting system of the disclosure.
Figure 6:
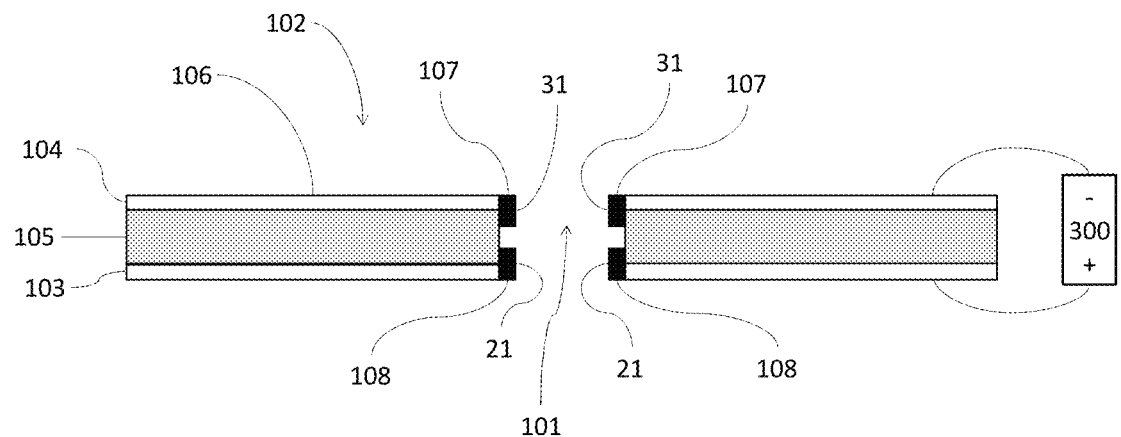
FIG. 6 shows a side view component fitting system of the disclosure.

The plug 10 may be mounted in a substrate 1010 or in a composite board 102. The substrate 1010 is depicted in FIG. 4, and two embodiments of the composite board 102 are depicted in FIG. 5 and FIG. 6. FIG. 4, FIG. 5 and FIG. 6 are not drawn to scale. The composite board 102 had a bottom layer 103 and a top layer 104 made from anodised aluminium. The thickness of the bottom layer 103 and the thickness of the top layer 104 were about 0.7 mm. The bottom layer 103 and the top layer 104 were separated by an insulator 105 made from PE. The insulator 105 had a thickness of 4.6 mm so that the total thickness of the composite board 102 was about 6 mm. The substrate shown in FIG. 4 was a block of electrically insulating material fitted with a first conductor 301 and a second conductor 302 electrically connected to power supply 300 and to the top connection site 31 and to the bottom connection site 21, respectively.

As depicted in FIG. 5, the exterior surface 106 of the top layer 104 contained a hole aligned with a hole through the insulator 105 to thereby provide a socket 101. In FIG. 6, bottom layer 103 also had a hole aligned with the holes of the top layer 104 and the insulator 105 so that the socket 101 was a through-going hole in the composite board 102.

The socket 101 contained a nickel coated brass ring as a top coupling portion 107 (in FIG. 5 and FIG. 6), and when the socket 101 was a through-going hole (as in FIG. 6), a further nickel coated brass ring served as a bottom coupling portion 108. The top coupling portion 107 provided a top connection site 31 for establishing electrical connection to the top contact interface 33 of the top connection element 30 (FIG. 5 and FIG. 6). Likewise, the bottom coupling portion 108 provided the bottom connection site 21 (FIG. 6). In the embodiment shown in FIG. 5, the oxide layer on the aluminium surface was removed, and the surface was coated with nickel to expose the surface of the bottom layer 103 and provide the bottom connection site 21. The coupling portions 107,108 had an extension in the thickness of the top layer 104 and the bottom layer 103 larger than the thickness of the top layer 104 and the thickness of the bottom layer 103. Specifically, the extension of the coupling portions 107, 108 was about 2 mm, e.g., the thickness of the coupling portions 107, 108 was about 2 mm.

The socket 101 was sized for the plug 10 to fit in the socket 101 and establish electrical connections between the bottom layer 103 and the bottom connection element 20 and between the top layer 104 and the top connection element 30 via the contact interfaces 23,33 and the respective connection sites 21,31.

A power supply 300 was electrically connected to the bottom layer 103 and the top layer 104. Specifically, the power supply 300 provided a direct current (DC) appropriate for the LED in the plug 10; as depicted the power supply provided a constant voltage of 12 V.

Thereby a flexible system 100 is provided where the plug 10 can easily be mounted in and removed from the socket 101.

Example 2

Figure 7:
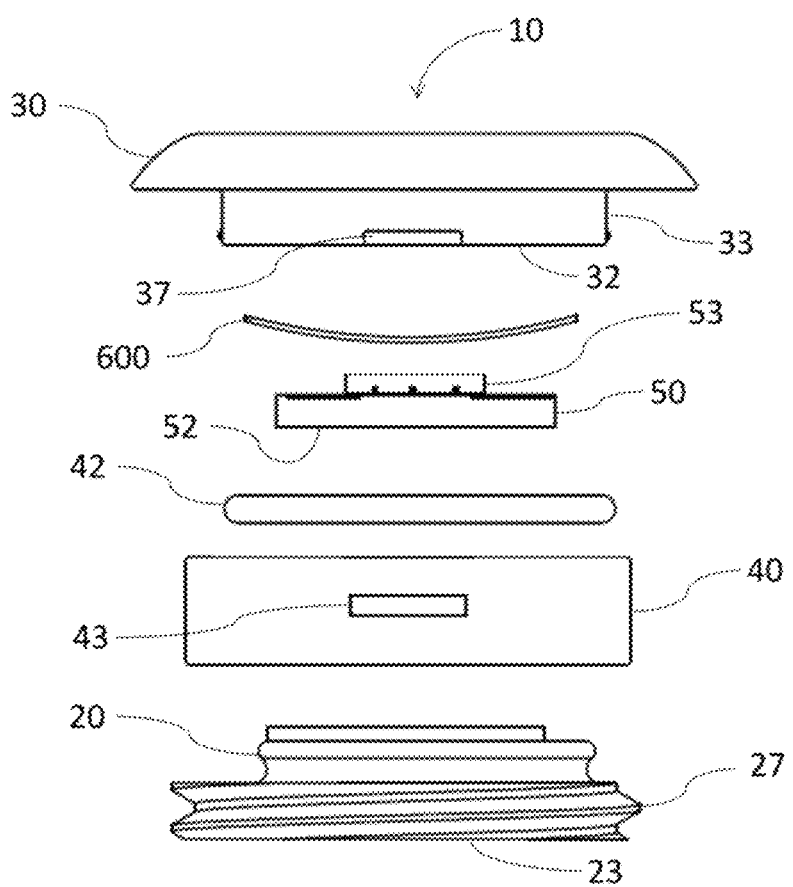
FIG. 7 shows an exploded side view of a plug of the disclosure.
Figure 8:
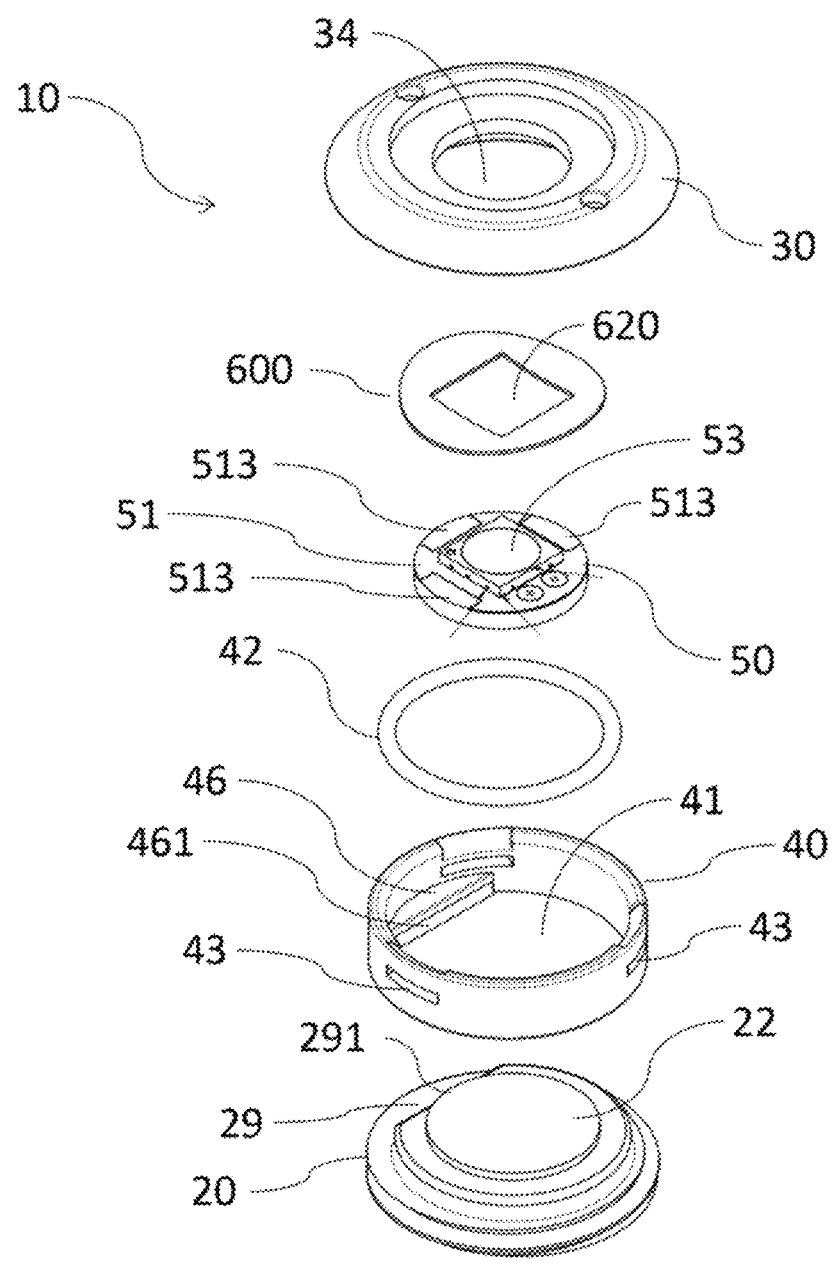
FIG. 8 shows an exploded perspective view of a plug of the disclosure.
Figure 9:
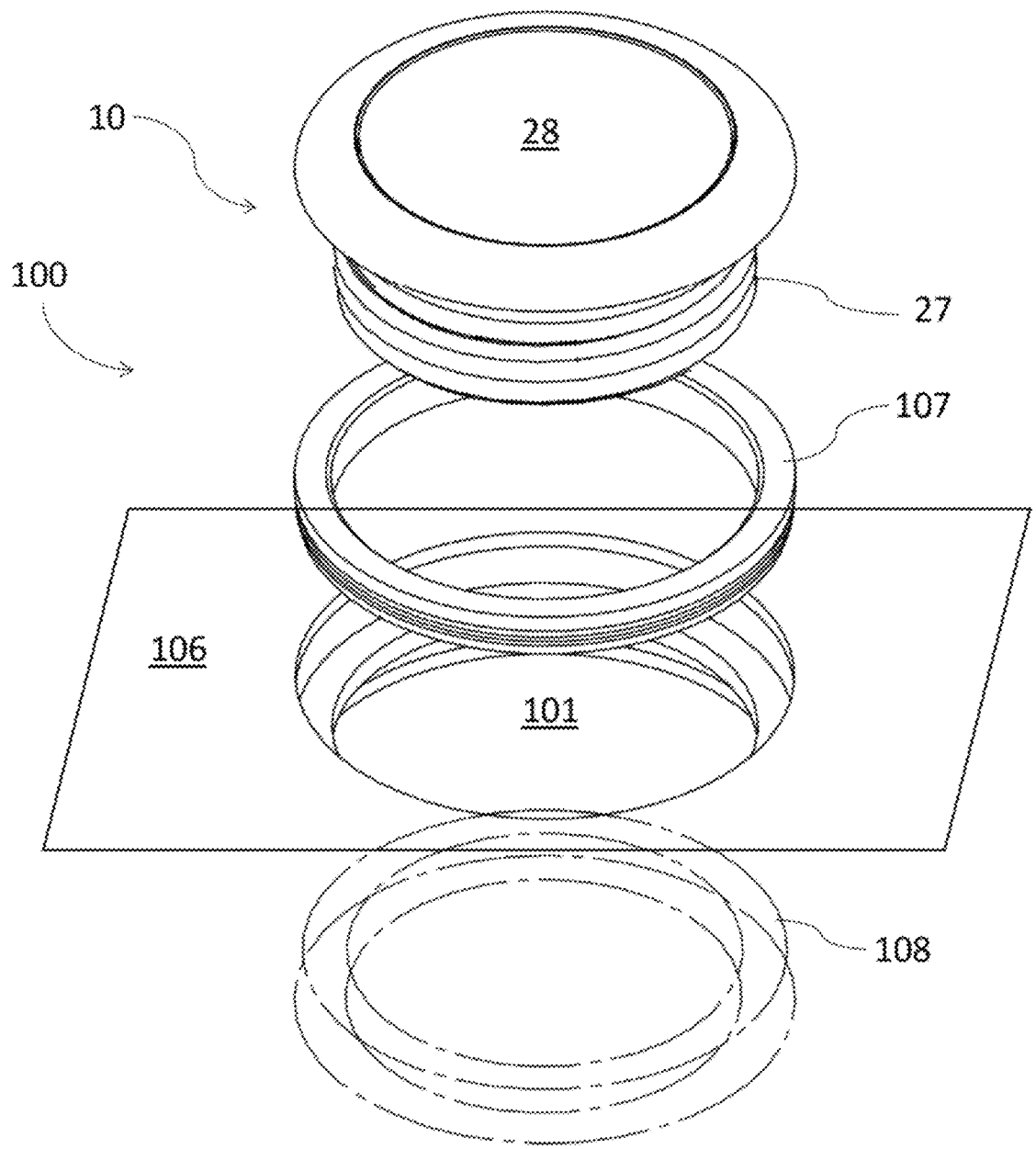
FIG. 9 shows an exploded perspective view of a component fitting system of the disclosure.
Figure 10:
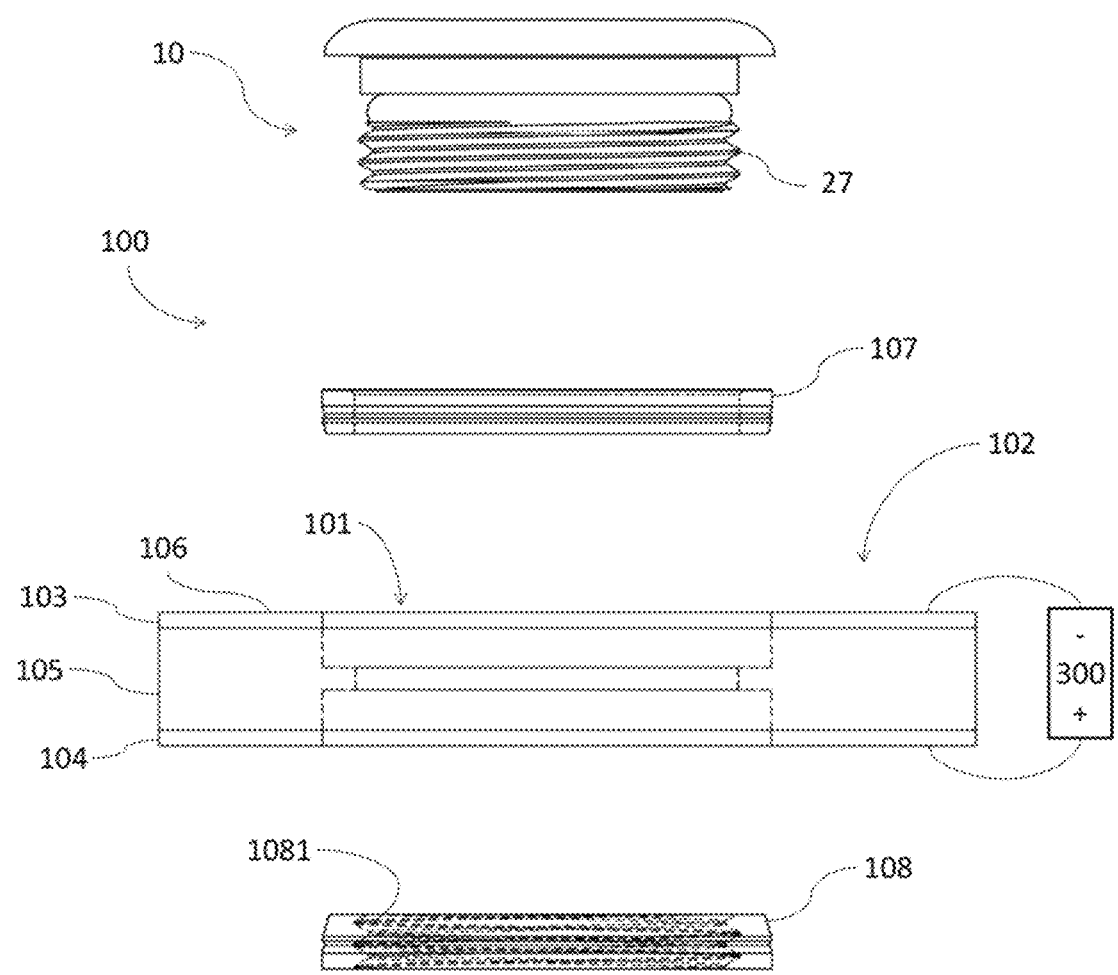
FIG. 10 shows an exploded side view of a component fitting system of the disclosure.

Another example of a plug 10 of the disclosure is depicted in FIG. 7 and FIG. 8, and a component fitting system 100 with the plug 10 is illustrated in FIG. 9 and FIG. 10. The plug 10 had a bottom connection element 20 and a top connection element 30 made from nickel coated brass. The assembly component 40 was made from polyether ether ketone (PEEK). The bottom connection element 20 was the anode and the top connection element 30 was the cathode. The electronic component 53 of the plug 10 was an LED with a power rating of 5 W and capable of providing white light.

The components of the plug 10 had a round shape to be mounted, in this case screwed into, a socket 101 of a component fitting system 100 of the invention. Specifically, the bottom connection element 20 had an outer surface with a helical thread 27 complementary to a helical thread 1081 in the bottom coupling portion 108.

The circuit board 50 was made form aluminium and had a round shape with a diameter of about 15 mm. The thickness of the circuit board 50 was about 1.5 mm. The electronic component 53 (i.e. an LED) was mounted on the first surface 51 of the circuit board 50 to be electrically connected to the anodic connection point and the cathodic connection point (not shown in FIG. 8). The first surface 51 contained cathodic electrical connection sites 513, and an electrical connection between the cathodic electrical connection sites 513 and the top inner surface 32 was established via a spring element 600. The spring element 600 was made from bronze and had an annular shape deviating from flat with hole 620 for the electronic component 53. The spring element 600 provided a pressure on the top inner surface 32 of about 5 MPa.

The circuit board 50 did not have alignment protrusions or notches, but the plug 10 in this example contained a rubber O-ring 42 surrounding the circuit board 50 a keeping it in place. The O-ring 42 had an inner diameter of about 17 mm, and the material of the O-ring 42 had a diameter of about 1 mm.

The electrically conducting second surface 52 of the circuit board 50 was soldered to the bottom inner surface 22 of the bottom connection element 20. Specifically, about 50% of the surface area of the bottom inner surface 22 was soldered to the bottom inner surface 22.

The cathodic top connection element 30 was round and had a hole 34 aligned with the electronic component 53 in the assembled plug 10, and a top contact interface 33 with locking pins 37. Specifically, three locking pins 37 extended from a centre point of the cathodic top connection element 30 on the top contact interface 33 on which they were evenly distributed. The extension of the locking pins 37 from the top contact interface 33 was about 0.5 mm, and they had a height of about 0.4 mm and a width of about 3 mm. The assembly component had three complementary holes 43 aligned with the locking pins 37 of the top connection element 30.

In the bottom connection element 20 a positioning segment 29 was removed from the material facing the inner diameter of the assembly component 40, and a complementary positioning segment 46 was included at the location of the positioning segment 29 in the inner surface of the assembly component 40 (FIG. 8). The width of the positioning segment 29 corresponds to an angle of about 60°. The complementary positioning segment 46 has a locking pin 461 for engaging a complementary hole 291 at the positioning segment 29 in the bottom connection element 20.

Thus, when the top connection element 30 is assembled with the assembly component 40, the locking pins 37 engage the complementary holes 43, and correspondingly, when the bottom connection element 20 is assembled with the assembly component 40, the locking pin 461 engages the complementary hole 291. Thereby, the bottom connection element 20, the assembly component 40 and the top connection element 30 are assembled in a press-fit interaction.

After assembly of the bottom connection element 20, the assembly component 40 and the top connection element 30, the top connection element 30 was provided with a light processing layer 28 (as shown in FIG. 9). The light processing layer 28 was a glass plate with a thickness of about 1 mm.

A composite board 102 was obtained and provided with a through-going hole as the socket 101. The composite board 102 had a bottom layer 103 and a top layer 104 made from aluminium, in this case aluminium with a layer of paint. The thickness of the bottom layer 103 and the thickness of the top layer 104 were about 0.5 mm. The bottom layer 103 and the top layer 104 were separated by an insulator 105 made from PE. The insulator 105 had a thickness of 5 mm so that the total thickness of the composite board 102 was about 6 mm.

The socket 101 contained a nickel coated brass ring as a top coupling portion 107, and a further nickel coated brass ring served as a bottom coupling portion 108. The bottom coupling portion 108 provided the bottom connection site 21 and had a helical thread 1081 complementary to the helical thread 27 of the bottom connection site 21. The top coupling portion 107 provided a top connection site 31 for establishing electrical connection to the top contact interface 33 of the top connection element 30, but the top coupling portion 107 did not have a helical thread. Exploded views of the component fitting system 100 with the top coupling portion 107, the bottom coupling portion 108 and the plug 10 are shown in FIG. 9 and FIG. 10. The top coupling portion 107 and the bottom coupling portion 108 were rings and had a dimension in the plane normal to the plane of the ring of 2 mm. Thus, when the top coupling portion 107 and the bottom coupling portion 108 were mounted by press fitting into the socket, the material of the top coupling portion 107 and the bottom coupling portion 108 extended 2 mm into the socket as calculated from the respective surfaces of the composite board 102. The top coupling portion 107 and the bottom coupling portion 108 were flush with the surface.

A power supply 300 was electrically connected to the bottom layer 103 and the top layer 104. Specifically, the power supply 300 provided a DC appropriate for the LED in the plug 10; as depicted the power supply provided a constant voltage of 12 V.

Thereby a flexible system 100 is provided where the plug 10 can easily be mounted in and removed from the socket 101.

Example 3

A plug 10 and a composite board 102 as described in Example 2 were made, but in addition to the components described in Example 2, the composite board 102 also comprised a controller for controlling an electronic component 53, and the electronic component 53 was an adjustable LED where the colour composition of the light emitted from the LED was controllable, e.g., to be a specific colour or white light having a colour temperature in the range of 1,500 K to 8,000 K. The controller included a WiFi access point so that the colour of the LED could be controlled wirelessly. In a further example, the controller did not include a WiFi access point but was configured to control the colour of the LED via direct power line communication (PLC).

Example 4

A composite board 102 having a controller as described in Example 3 was prepared, and the composite board 102 further had a plurality of identical sockets. A range of plugs was prepared so that a plug 10 have a desirable electronic component 53 can be selected a mounted in a socket 101. The range of plugs 10 comprised electronic components 53 selected from: a microphone, a camera, a sensor, e.g., a sensor for temperature or humidity, etc., a radio transmitter, a radio receiver, an antenna, an access point for wireless communication, e.g., WiFi, LiFi, Bluetooth, adjustable LEDs, LEDs providing ultraviolet (UV) light, e.g., UV-A, UV-B or UV-C light, and LEDs providing infrared (IR) light. The easy mounting and removal of the plugs 10 from the sockets 101 allow design of a system having desired functionalities, which can be controlled by the user of the system 100. For example, the component fitting system 100 may have an access point for wireless communication, a sensor and an LED capable of emitting light with a desired wavelength.

Example 5

A composite board 102 was constructed to be used as a shelf in a vertical farming system. Specifically, the composite board 102 had a length of 2 m and a width of 60 cm. The composite board 102 had three rows of sockets 101 in the axial direction of the composite board 102, and each row had 10 sockets 101 with the sockets 101 being equidistant from each other. The vertical farming system comprised plugs 10 where the electronic component were LEDs providing light with a wavelength within the photosynthetically active radiation. Each LED had a power rating of 5 W.

The composite board 102 had a thickness of 6 mm, and the plugs 10 and sockets 101 were as described for FIG. 7, FIG. 8, FIG. 9 and FIG. 10. The vertical farming system comprised a support frame (not shown), configured to hold nine composite boards 102 stacked above each other at a distance between the composite boards 102 of 50 cm and a bottom shelf not having any sockets. The composite board 102 was configured to be replaceably inserted in the support frame where the support frame was electrically connected to a power supply 300 providing a constant voltage of 24 V between the bottom layer 103 and the top layer 104 of each composite board 102.

The exterior surface 106 of the composite boards 102 was the lower surface of the shelf facing a further composite board 102 below the composite board 102. The opposite surface was coated with a polymer layer making the composite board 102 watertight to prevent water from entering the sockets and was further configured to hold a growth medium for housing a growing plant.

The vertical farm thus comprised 10 shelves with a growth medium stacked on top of each other at distance of 50 cm, where the plugs 10 having LEDs for providing light for the plant growing on the shelf were supplied electricity via the support frame and the composite boards 102. The plugs 10 could be easily replaced to thereby replace the LED.

Example 6

A composite board 102 was designed as part of a disinfection unit (not shown) for use in the disinfection of goods passing through the disinfection unit. The disinfection unit had four composite boards 102 where one composite board 102 was a floor, one composite board 102 was a ceiling and two composite boards 102 were walls. The four composite boards 102 were arranged with the exterior surfaces 106 facing an interior space of the disinfection unit, which interior space defined a disinfection volume. The bottom layers 103 and the top layers 104 of the composite boards 102 were in serial electrical connection with each other, and a power supply 300 provided a constant voltage of 12 V between the bottom layers 103 and the top layers 104.

Specifically, the composite boards 102 had a length of 220 cm and a width of 65 cm, and each composite board 102 had two axially located rows of sockets 101 with eight sockets 101 in each row. The composite board 102 had a thickness of 6 mm, and the plugs 10 and sockets 101 were as described for FIG. 7, FIG. 8, FIG. 9 and FIG. 10. The plugs 10 of the disinfection unit contained a UV-C LED as the electronic component with a power rating of 3 W.

Example 7

Figure 11:
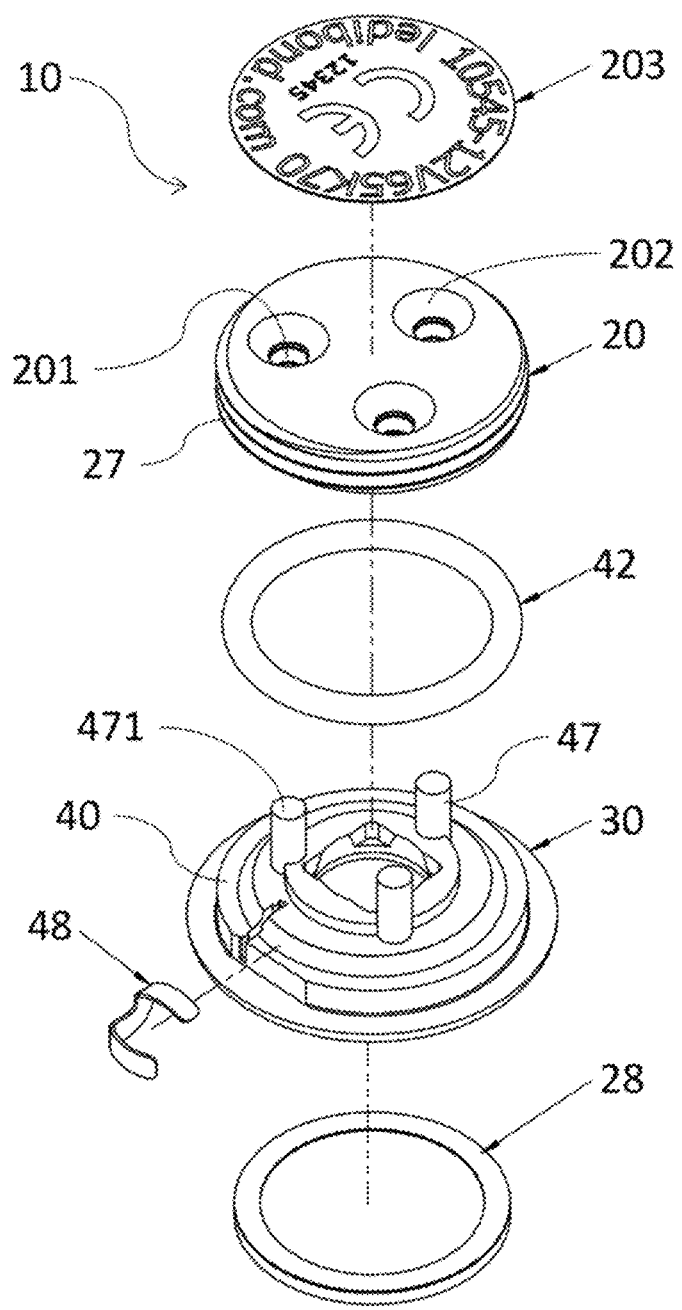
FIG. 11 shows an exploded top view of a plug of the disclosure.

A plug 10 was produced, which did not rely on press-fitting of the components. The plug 10 is illustrated in FIG. 11. The plug 10 had a bottom connection element 20 and a top connection element 30 made from nickel coated brass. The assembly component 40 was made from high-density PE. The bottom connection element 20 was the anode and the top connection element 30 was the cathode. The electronic component 53 of the plug 10 was an LED with a power rating of 5 W and capable of providing white light. The dimensions of the plug 10 were identical to the dimensions of the plug 10 described in Example 2, and the plug 10 could readily replace the plugs 10 in the composite board 102 of the component fitting systems 100 in Examples 2 to 6.

The circuit board 50 (not shown in FIG. 11) was soldered to the bottom inner surface 22 (not shown in FIG. 11).

The bottom connection element 20 had a helical thread 27 and three holes 201 for receiving protruding pins 47 of the assembly component 40. The holes 201 had a frustoconical inlet section 202. The diameter of the holes 201 was slightly larger than the diameter of the protruding pins 47.

The top connection element 30 and the assembly component 40 were aligned and an assembly clip 48 was used to keep the top connection element 30 and the assembly component 40 attached to each other. A spring element 60 (not shown in FIG. 11) was included between the top connection element 30 and the assembly component 40 to provide an electrical connection between the top inner surface 32 (not shown in FIG. 11) of the top connection element 30 and the circuit board 50.

The assembly component 40 had three protruding pins 47, likewise made from PE. After assembly of the top connection element 30 and the assembly component 40, an O-ring 42 with an inner diameter of about 17 mm was placed on the assembly component 40. The bottom connection element 20 was placed on the assembly of the top connection element 30 and the assembly component 40 with the three holes 201 being aligned with the protruding pins 47 so that the protruding pins 47 were received in the holes 201. Pressure was applied to the bottom connection element 20, and heat was applied to melt the ends 471 of the protruding pins 47 to thereby melt the PE and allowing the molten PE to distribute in the frustoconical inlet sections 202. Specifically, the heat was applied from a heating block, which also applied pressure to the ends 471 of the protruding pins 47 for the ends 471 of the protruding pins 47 to be flush with the surface. The PE was cooled to solidify and lock the top connection element 30, the assembly component 40, and the bottom connection element 20 to each other.

A glass light processing layer 28 was mounted in an appropriately sized well (not shown) in the top connection element 30. Finally, the assembled plug 10 was fitted with a label 203.

In further examples, plugs 10 were produced having other electronic components 53 than white light LEDs. Thus, plugs were made having a camera, a sensor, a sensor for temperature, a sensor for humidity, and LEDs providing light with a wavelength within the photosynthetically active radiation. The plugs 10 were appropriate for the vertical farming system described in Example 5. Further plugs were made have LEDs providing UV-C light for the disinfection unit of Example 6.

REFERENCE SIGNS LIST

10 Plug
20 Bottom connection element
21 Bottom connection site
22 Bottom inner surface
23 Bottom contact interface
24, 44 Alignment protrusion
26, 36, 45 Grooves
27 Helical thread
28 Light processing layer
29 Positioning segment
201 Hole for protruding pin
202 Inlet section 202
203 Label
221 Indent
30 Top connection element
31 Top connection site
32 Top inner surface
33 Top contact interface
34 Hole in the top connection element
37, 461 Locking pin
40 Assembly component
41 Hole in the assembly component
42 O-ring
43, 291 Complementary hole
46 Complementary positioning segment
47 Protruding pin
471 End of protruding pin
48 Assembly clip
50 Circuit board
51 First surface
511 Anodic connection point
512 Cathodic connection point
513 Electrical connection site
52 Electrically conducting second surface
53 Electronic component
25, 35, 54 Alignment notch
60, 600 Spring element
61 Teeth
62, 620 Hole
100 Component fitting system
101 Socket
1010 Substrate
102 Composite board
103 bottom layer
104 top layer
105 Insulator
Exterior surface 106
107 Top coupling portion
108 Bottom coupling portion
1081 Helical thread
300 Power supply
301 First conductor
302 Second conductor

What is claimed is:

1. A plug for mounting in a socket of a substrate with bottom and top connection sites, the plug comprising:
    a bottom connection element configured to couple to the bottom connection site, the bottom connection element having a bottom inner surface and a bottom contact interface for establishing an electrical connection to the substrate;

a top connection element configured to couple to the top connection site, the top connection element having a top inner surface and a top contact interface for establishing an electrical connection to the substrate;

an assembly component separating the bottom connection element from the top connection element;

a circuit board positioned between the bottom connection element and the top connection element the circuit board has a first surface with electrical connection sites and an electrically conducting second surface and carries an electronic component on the first surface or the electrically conducting second surface; and the electrically conducting second surface being in electric connection with the bottom inner surface and the electrical connection sites of the first surface being in electric connection with the top inner surface.

2. An electric apparatus comprising:

a substrate formed of a composite board having an electrically conducting top layer, an electrically conducting bottom layer, and a socket including a top connection site and a bottom connection site; and a plug according to claim 1, wherein the socket is located on or in an exterior surface of the top or bottom layers.

3. The plug according to claim 1, wherein the distance between the electrically conducting second surface and the bottom inner surface is in the range of 0 μm to 300 μm.

4. The plug according to claim 1, further comprising a spring element positioned between the first surface and the top inner surface or between the electrically conducting second surface and the bottom inner surface.

5. The plug according to claim 1, wherein the circuit board is an aluminum plate or a copper plate and the electrically conducting second surface is coated with a metal selected from gold, platinum, silver, nickel, and their mixtures, combinations, and alloys.

6. The plug according to claim 1, wherein the plug does not comprise a spring element between the electrically conducting second surface and the bottom inner surface.

7. The plug according to claim 1, wherein the plug does not comprise a thermal paste between the electrically conducting second surface and the bottom inner surface.

8. The plug according to claim 1, wherein the assembly component is connected to at least one of the bottom connection element and the top connection element by a form-fitting connection.

9. The plug according to claim 1, wherein the electrically conducting second surface has a surface area and 2% to 100% of the surface area is connected to the bottom inner surface by soldering.

10. The plug according to claim 9, wherein the bottom inner surface is provided with at least one indent or trench.

11. A component fitting system comprising:

a substrate formed of a composite board comprising a bottom layer and a top layer of an electrically conducting material, which bottom layer and top layer are separated by an insulator of an electrically insulating material, the bottom layer or the top layer having an exterior surface;

a socket formed in the exterior surface, the socket extending at least through the insulator and one of the bottom layer and the top layer, the socket having a bottom connection site at the bottom layer and a top connection site at the top layer;

a plug configured for mounting in the socket, the plug comprising:

a bottom connection element complementary to the bottom connection site, the bottom connection element having a bottom inner surface and a bottom contact interface for establishing an electrical connection to the substrate;

a top connection element complementary to the top connection site, the top connection element having a top inner surface and a top contact interface for establishing an electrical connection to the substrate;

an assembly component separating the bottom connection element from the top connection element; and a circuit board positioned between the bottom connection element and the top connection element, which circuit board has a first surface with electrical connection sites and an electrically conducting second surface and which circuit board carries an electronic component on the first surface or the electrically conducting second surface, wherein the electrically conducting second surface being in electric connection with the bottom inner surface and the electrical connection sites of the first surface being in electric connection with the top inner surface, wherein the bottom connection site and the top connection site are complementary to the bottom connection element and the top connection element, respectively, of the plug, and wherein the plug is mounted in the socket to establish electrical connection between the bottom connection site and the bottom connection element and between the top connection site and the top connection element.

12. The component fitting system according to claim 11, wherein the socket is located on or in an exterior surface of the top or bottom layers.

13. The component fitting system according to claim 11, wherein the distance between the electrically conducting second surface and the bottom inner surface is in the range of 0 μm to 300 μm.

14. The component fitting system according to claim 11 further comprising a spring element positioned between the first surface and the top inner surface or between the electrically conducting second surface and the bottom inner surface.

15. The component fitting system according to claim 11, wherein the circuit board is an aluminium plate or a copper plate and the electrically conducting second surface is coated with a metal selected from gold, platinum, silver, nickel, and their mixtures, combinations, and alloys.

16. The component fitting system according to claim 11, wherein the plug does not comprise a spring element between the electrically conducting second surface and the bottom inner surface.

17. The component fitting system according to claim 11, wherein the plug does not comprise a thermal paste between the electrically conducting second surface and the bottom inner surface.

18. The component fitting system according to claim 11, wherein the assembly component is connected to at least one of the bottom connection element and the top connection element by a form-fitting connection.

19. The component fitting system according to claim 11, wherein the electrically conducting second surface has a surface area and 2% to 100% of the surface area is connected to the bottom inner surface by soldering.

20. The component fitting system according to claim 19, wherein the bottom inner surface is provided with at least one of an indent and a trench.

* * * * *